United States Patent
Ito

(10) Patent No.: US 10,935,150 B2
(45) Date of Patent: Mar. 2, 2021

(54) COMPONENT MOUNTER

(71) Applicant: FUJI CORPORATION, Chiryu (JP)

(72) Inventor: Hidetoshi Ito, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 260 days.

(21) Appl. No.: 16/068,736

(22) PCT Filed: Jan. 19, 2016

(86) PCT No.: PCT/JP2016/051432
§ 371 (c)(1),
(2) Date: Jul. 9, 2018

(87) PCT Pub. No.: WO2017/126031
PCT Pub. Date: Jul. 27, 2017

(65) Prior Publication Data
US 2019/0024813 A1 Jan. 24, 2019

(51) Int. Cl.
*F16K 25/00* (2006.01)
*H05K 13/04* (2006.01)
*H05K 13/08* (2006.01)

(52) U.S. Cl.
CPC .......... *F16K 25/00* (2013.01); *H05K 13/041* (2018.08); *H05K 13/0409* (2018.08); *H05K 13/0413* (2013.01); *H05K 13/08* (2013.01); *H05K 13/0895* (2018.08)

(58) Field of Classification Search
CPC .. F16K 25/00; H05K 13/0409; H05K 13/041; H05K 13/0413; H05K 13/08
See application file for complete search history.

(56) References Cited

U.S. PATENT DOCUMENTS

| | | | | | |
|---|---|---|---|---|---|
| 5,960,534 | A | * | 10/1999 | Yazawa | H05K 13/0812 29/743 |
| 6,076,394 | A | * | 6/2000 | Tsuda | H05K 13/082 73/37 |
| 6,662,438 | B2 | * | 12/2003 | Suhara | H05K 13/041 29/743 |

(Continued)

FOREIGN PATENT DOCUMENTS

| | | |
|---|---|---|
| EP | 0 315 161 A2 | 5/1989 |
| EP | 2 797 398 A2 | 10/2014 |

(Continued)

OTHER PUBLICATIONS

International Search Report dated Apr. 26, 2016 in PCT/JP2016/051432, filed on Jan. 19, 2016.

*Primary Examiner* — Minh N Trinh
(74) *Attorney, Agent, or Firm* — Oblon, McClelland, Maier & Neustadt, L.L.P.

(57) ABSTRACT

A rotary head, on which are arranged in a circumferential direction multiple nozzle holders each holding a suction nozzle, is provided with, separately to first negative pressure supply unit that supplies negative pressure to the suction openings of all the suction nozzles, second negative pressure supply unit that supplies negative pressure to the suction nozzle held by the nozzle holder that is lowerable when that nozzle holder is lowered. Accordingly, when performing pickup operation and mounting operation using the suction nozzle, the state of the suction nozzle is not affected by the state of the other suction nozzles.

5 Claims, 15 Drawing Sheets

(56) References Cited

U.S. PATENT DOCUMENTS

| | | | | |
|---|---|---|---|---|
| 6,931,718 B2* | 8/2005 | Isogai | ............... | H05K 13/04 29/721 |
| 2012/0151756 A1* | 6/2012 | Amano | ............ | H05K 13/0404 29/720 |
| 2015/0237773 A1* | 8/2015 | Nishiyama | ......... | H05K 13/0404 29/743 |
| 2019/0024813 A1* | 1/2019 | Ito | ...................... | H05K 13/041 |
| 2020/0100406 A1* | 3/2020 | Ito | ...................... | H05K 13/0061 |

FOREIGN PATENT DOCUMENTS

| | | |
|---|---|---|
| JP | 7-212099 A | 8/1995 |
| JP | 2003-80485 A | 3/2003 |
| JP | 2007-035872 A | 2/2007 |
| JP | 2011-066205 A | 3/2011 |
| JP | 2012-080064 A | 4/2012 |
| JP | 2013-235886 A | 11/2013 |
| JP | 2015-95553 A | 5/2015 |
| WO | 2005/090011 A1 | 9/2005 |
| WO | 2013-145228 A1 | 10/2013 |
| WO | 2014/136231 A1 | 9/2014 |

* cited by examiner

COMPONENT MOUNTER

TECHNICAL FIELD

The present application relates to a component mounter for picking up a component and mounting the component on a mounting target.

BACKGROUND ART

Conventionally, as this type of component mounter, there are devices provided with a rotary head on which multiple suction nozzles are arranged in a circle, and component pickup operation and mounting operation using the suction nozzles is performed by revolving the multiple suction nozzles and lowering a suction nozzle at a specified revolving position (for example, refer to patent literature 1). With this component mounter, a negative pressure source is connected to the multiple suction nozzles via a negative pressure dividing path, and a positive pressure source is connected to the multiple suction nozzles via a positive pressure dividing path. Spool valves that switch between supplying and blocking negative pressure, and supplying and blocking positive pressure, to the multiple suction nozzles are provided respectively in the negative pressure dividing path and the positive pressure dividing path. Thus, the component mounter is able to pick up a component by lowering a suction nozzle and supplying negative pressure to the suction nozzle, and is able to mount the component by lowering the nozzle and supplying positive pressure to the suction nozzle.

Patent literature 1: WO2013-145228

BRIEF SUMMARY

However, with the above component mounter, the suction openings of all of the suction nozzles are connected to the dividing point of the dividing paths. Thus, the state of a suction nozzle performing pickup operation or mounting operation is easily influenced by the state of other suction nozzles (such as leaks or missing components at other suction nozzles).

An object of the present invention is for a state of a suction nozzle, which is one of multiple suction nozzles, that is performing pickup operation or mounting operation not to be influenced by the state of the other suction nozzles.

The present invention uses the following means to achieve the above object.

A first component mounter of the present invention is a component mounter for picking up a component and mounting the component on a mounting target, the component mounter including:

a suction nozzle configured to pick up a component at a tip section of the suction nozzle using suction;

a rotary head including a rotating body on which multiple nozzle holders are arranged in a circumferential direction, each of the nozzle holders being configured to hold the suction nozzle;

a moving device configured to move the rotary head in a horizontal direction; a rotating device configured to rotate the rotating body such that the multiple nozzle holders revolve in the circumferential direction;

a raising and lowering device configured to lower, from among the multiple nozzle holders, the nozzle holder that is at a specified revolving position;

wherein the multiple nozzle holders include a nozzle passage connected to the tip section of the suction nozzle being held by that nozzle holder, the rotating body includes a first negative pressure unit configured to supply negative pressure to the nozzle passages of, from among the multiple nozzle holders, all the nozzle holders via a first port, and a second negative pressure unit configured to supply negative pressure to the nozzle passage of, from among the multiple nozzle holders, the nozzle holder positioned at the specified revolving position via a second port, wherein the first port is configured to be open when the nozzle holder is at a raised position, and closed when the nozzle holder is at a lowered position, and the second port is configured to be closed when the nozzle holder is at a raised position, and open when the nozzle holder is at a lowered position.

The first component mounter of the present invention is provided with a first negative pressure unit and a second negative pressure unit on a rotating body on which multiple nozzle holders are arranged in a circumferential direction, the multiple nozzle holders each holding a suction nozzle. The first negative pressure unit is configured to supply negative pressure to the nozzle passages of, from among the multiple nozzle holders, all the nozzle holders via a first port, and the second negative pressure unit is configured to supply negative pressure to the nozzle passage of, from among the multiple nozzle holders, the nozzle holder positioned at the specified revolving position via a second port. Also, the first port is configured to be open when the nozzle holder is at a raised position, and closed when the nozzle holder is at a lowered position, and the second port is configured to be closed when the nozzle holder is at a raised position, and open when the nozzle holder is at the lowered position. In other words, separate to the first negative pressure unit, a different negative pressure unit (second negative pressure unit) that supplies negative pressure only to the suction nozzle held by a nozzle holder when the nozzle holder is at the lowered position is provided. Accordingly, when performing pickup operation and mounting operation using the suction nozzle, the state of the suction nozzle is not affected by the state of the other suction nozzles.

With the first component mounter of the present invention, the first port and the second port may be both configured to be open when the nozzle holder is at an intermediate position that is between the raised position and the lowered position. Accordingly, it is possible to prevent negative pressure being lost when raising or lowering of the nozzle holder causes switching of the negative pressure unit (first negative pressure unit or second negative pressure unit) that supplies negative pressure to the nozzle passage of the nozzle holder.

Also, the first component mounter of the present invention may further include a negative pressure supply state detecting sensor configured to detect a negative pressure supply state of the second negative pressure unit, and a pickup determining means configured to determine a component pickup state by the suction nozzle or a suction nozzle state, based on the negative pressure supply state detected by the negative pressure supply state detecting sensor. The second negative pressure unit provided with the negative pressure state detecting sensor, as described above, supplies negative pressure to the suction nozzle of the nozzle holder at the specified revolving position. Accordingly, the negative pressure supply state detected by the negative pressure supply state detecting sensor is not affected by the state of the other suction nozzles. As a result, it is possible to accurately determine the component pickup state or the suction nozzle state based on the negative pressure supply state detected by the negative pressure supply state detecting sensor.

Further, the first component mounter of the present invention may further include a negative pressure supply state detecting sensor configured to detect a negative pressure supply state of the second negative pressure unit, and a maintenance determining means configured to determine whether maintenance is required for the rotary head or for the suction nozzle, based on the negative pressure supply state detected by the negative pressure state detecting sensor. Accordingly, the negative pressure supply state detected by the negative pressure supply state detecting sensor is not affected by the state of the other suction nozzles. As a result, it is possible to accurately determine whether maintenance is required for the rotary head or the suction nozzle based on the negative pressure supply state detected by the negative pressure supply state detecting sensor.

Also, with the first component mounter of the present invention, the rotating body may include a positive pressure unit configured to supply positive pressure to the nozzle holder, from among the multiple nozzle holders, positioned at the specified revolving position via the second port, and a switching valve configured to switch a unit connected to the second port to and from the second negative pressure unit and the positive pressure unit.

A second component mounter of the present invention is a component mounter for picking up a component and mounting the component on a mounting target, the component mounter including:

a suction nozzle configured to pick up a component at a tip section of the suction nozzle using suction;

a rotary head including a rotating body on which multiple nozzle holders are arranged in a circumferential direction, each of the nozzle holders being configured to hold the suction nozzle;

a moving device configured to move the rotary head in a horizontal direction; a rotating device configured to rotate the rotating body such that the multiple nozzle holders revolve in the circumferential direction;

a raising and lowering device configured to lower, from among the multiple nozzle holders, the nozzle holder that is at a specified revolving position;

wherein the multiple nozzle holders include a nozzle passage connected to the tip section of the suction nozzle being held by that nozzle holder, the rotating body includes a negative pressure unit configured to supply negative pressure to the nozzle passages of, from among the multiple nozzle holders, all the nozzle holders, and a positive pressure unit configured to supply positive pressure to the nozzle passage of, from among the multiple nozzle holders, the nozzle holder positioned at the specified revolving position via a specified port, wherein the specified port is configured to be closed when the nozzle holder is at a raised position, and open when the nozzle holder is at a lowered position.

The second component mounter of the present invention may further include a positive pressure supply state detecting sensor configured to detect a positive pressure supply state of the positive pressure unit, and a pickup determining means configured to determine a component mounting state by the suction nozzle, based on the positive pressure supply state detected by the positive pressure supply state detecting sensor.

Further, the second component mounter of the present invention may further include a positive pressure supply state detecting sensor configured to detect a positive pressure supply state of the positive pressure unit, and a maintenance determining means configured to determine whether maintenance is required for the rotary head or for the suction nozzle, based on the positive pressure supply state detected by the positive pressure supply state detecting sensor.

DESCRIPTION OF EMBODIMENTS

Embodiments of the present invention are described below with reference to the figures.

Figure 1:
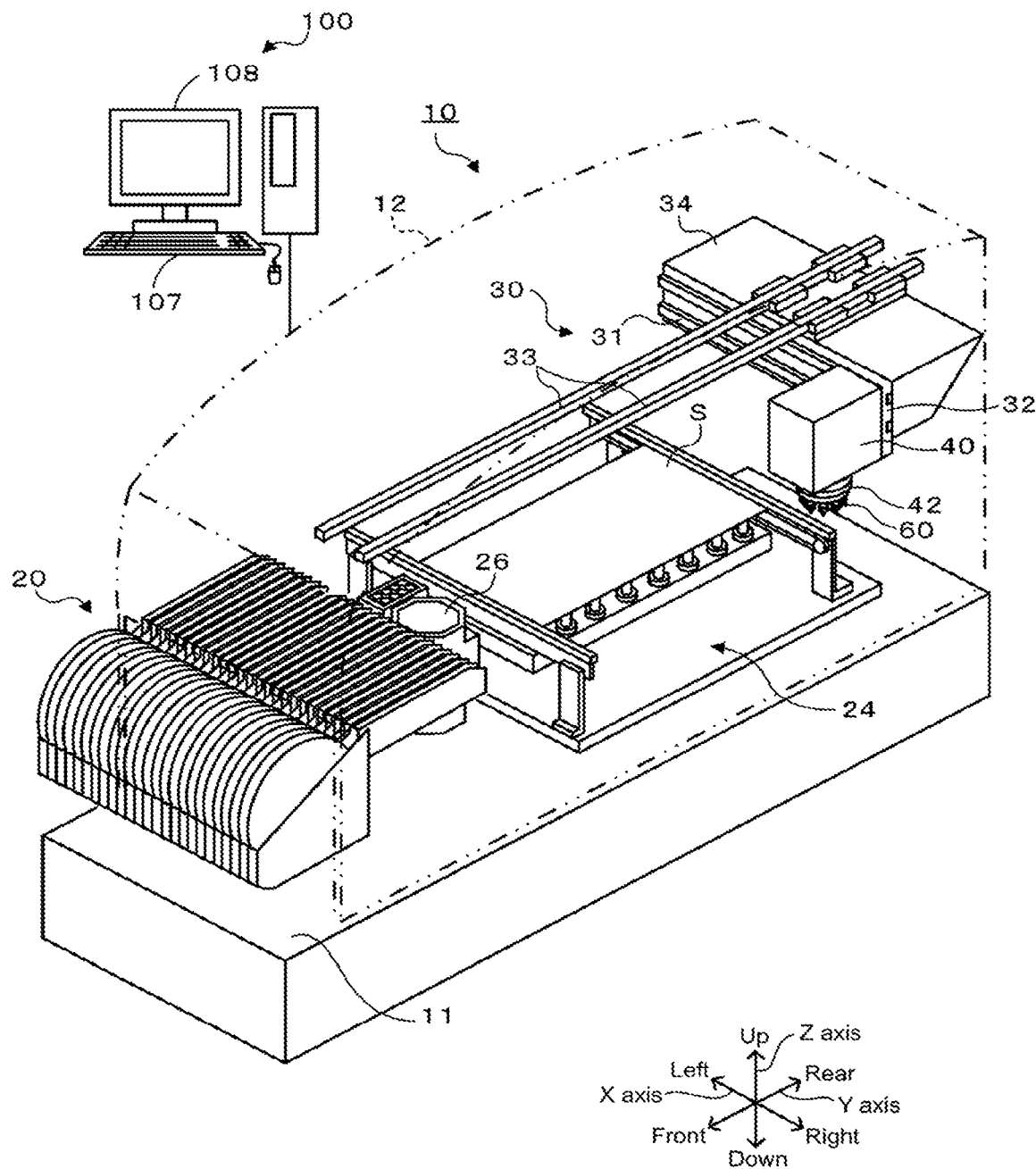
FIG. 1 schematically shows the configuration of component mounter 10, which is an embodiment of the present invention.
Figure 2:
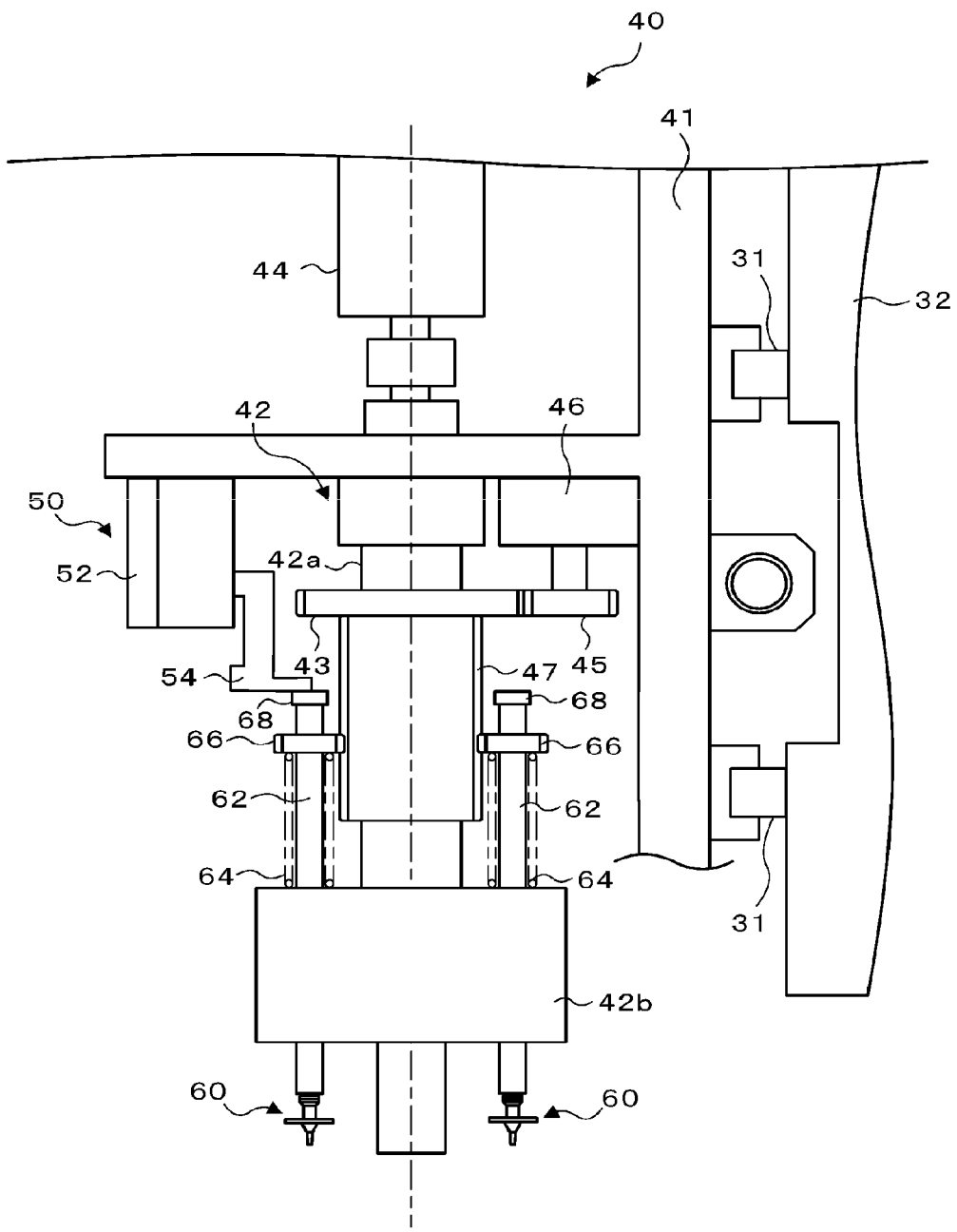
FIG. 2 schematically shows the overall configuration of head unit 40.
Figure 3:
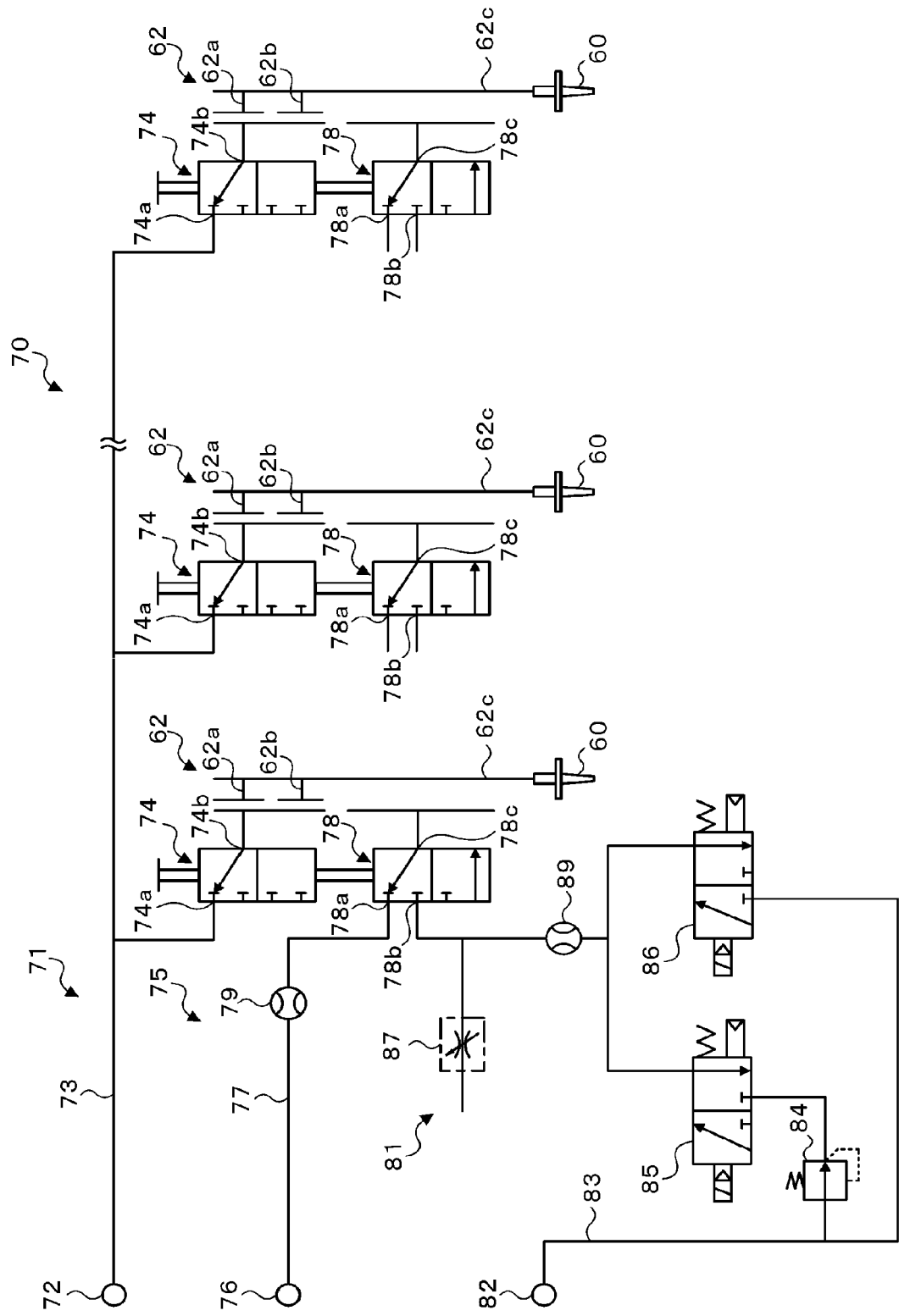
FIG. 3 schematically shows the configuration of negative pressure and positive pressure supply device 70.
Figure 4:
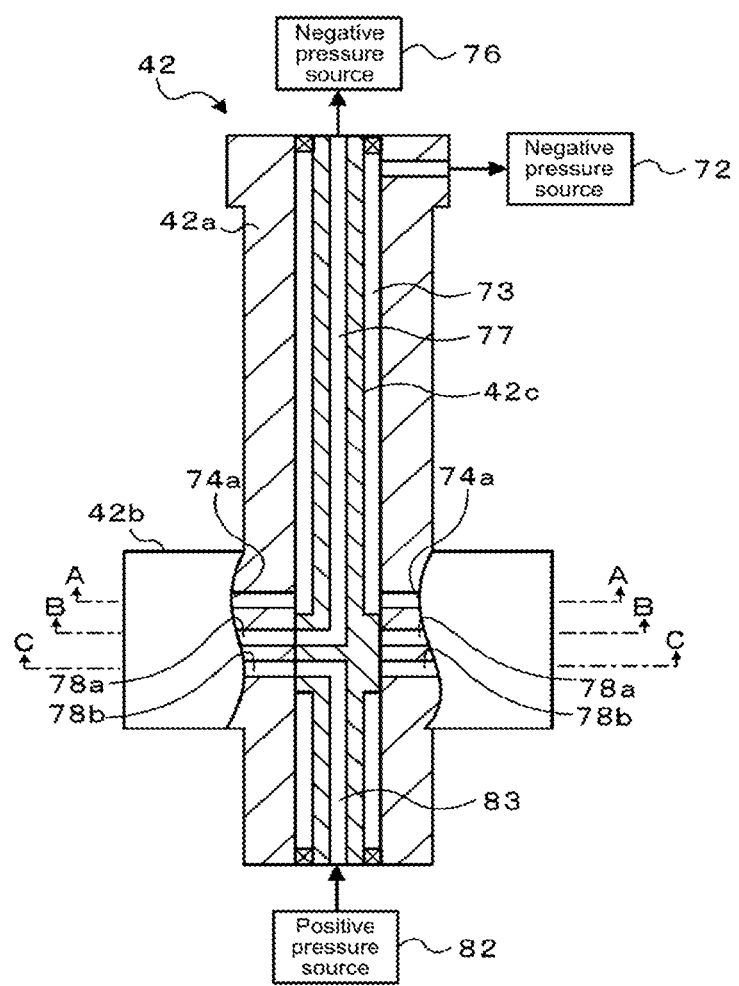
FIG. 4 shows a cross section of rotary head 42.
Figure 5:
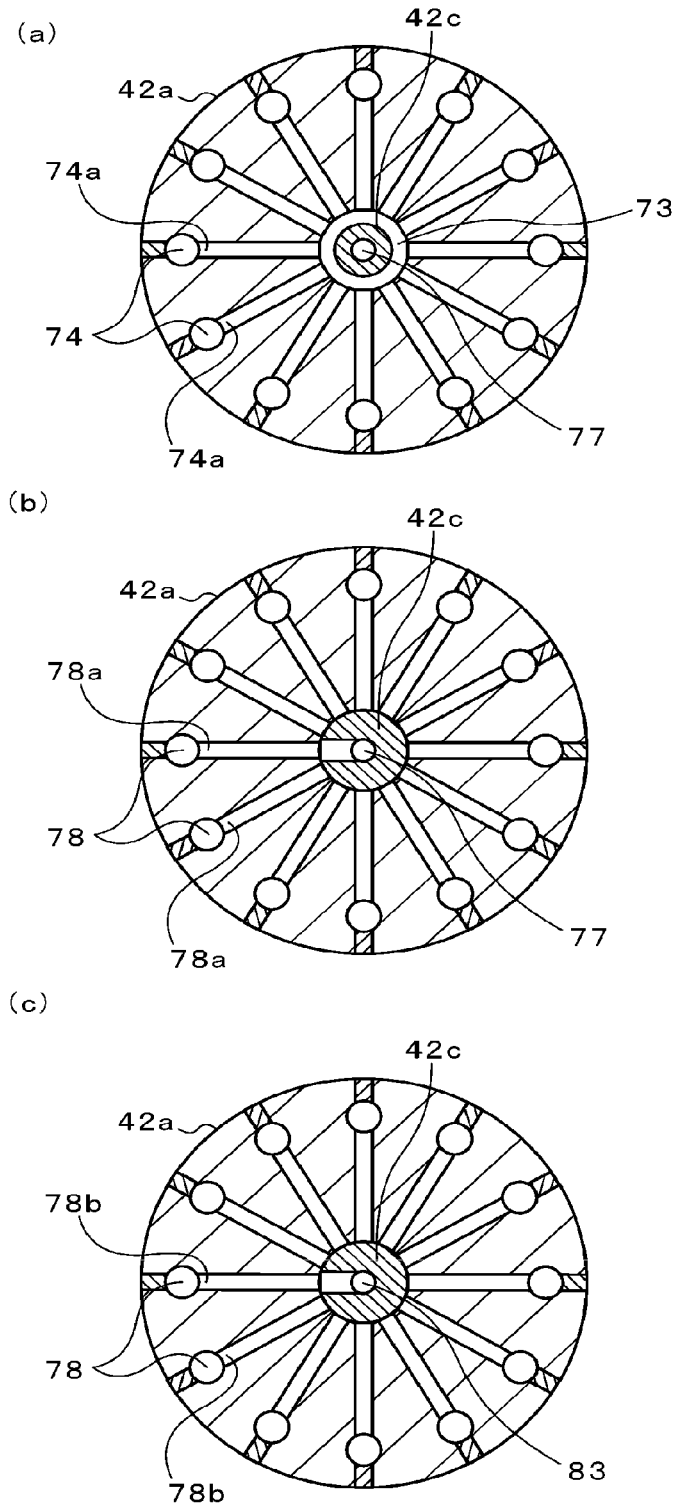
FIG. 5 shows cross sections at lines A-A, B-B, and C-C of FIG. 4.
Figure 6:
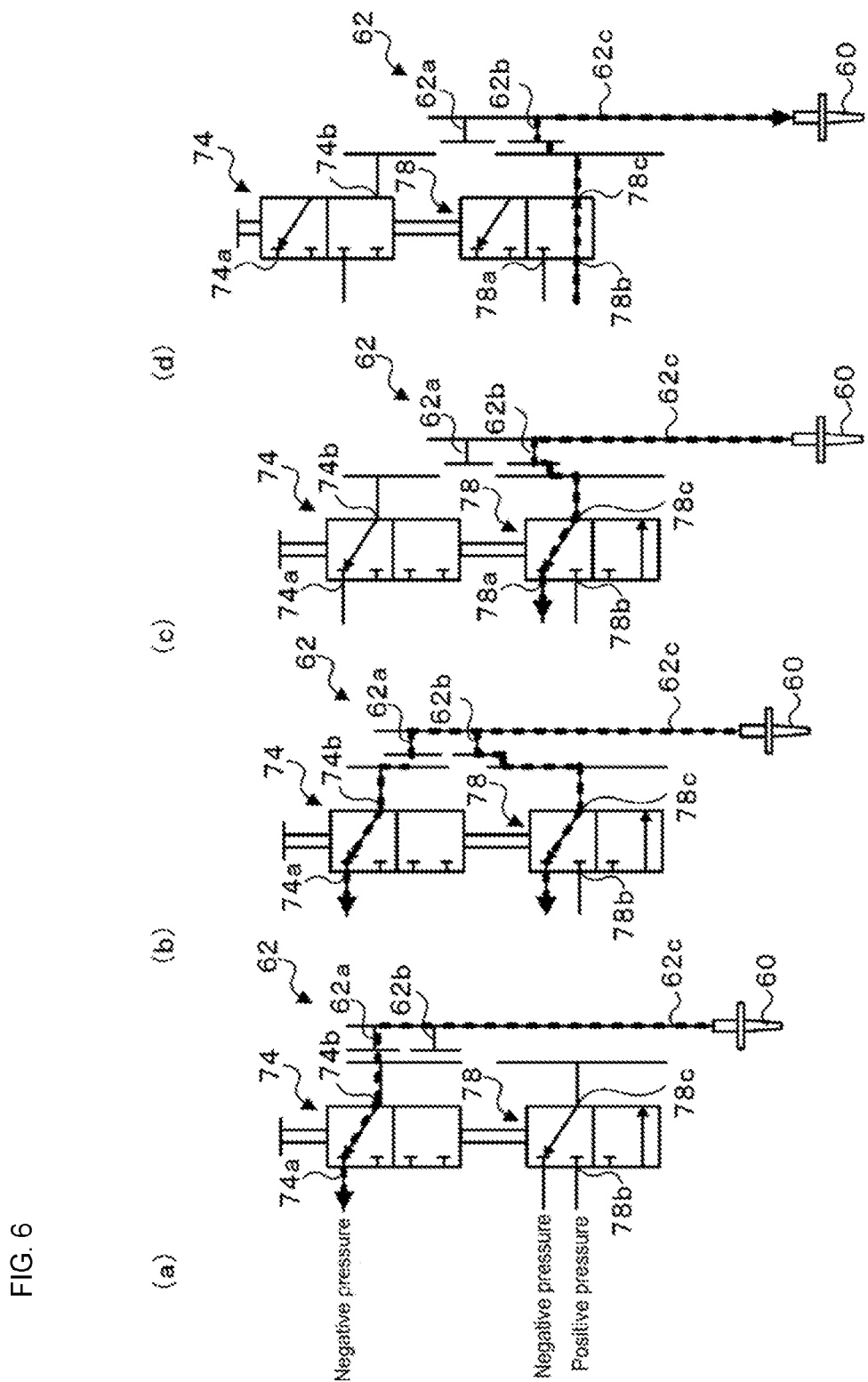
FIG. 6 illustrates states of supplying negative pressure and states of supplying positive pressure using negative pressure and positive pressure supplying device 70 to suction nozzle 60 that is lowered.
Figure 7:
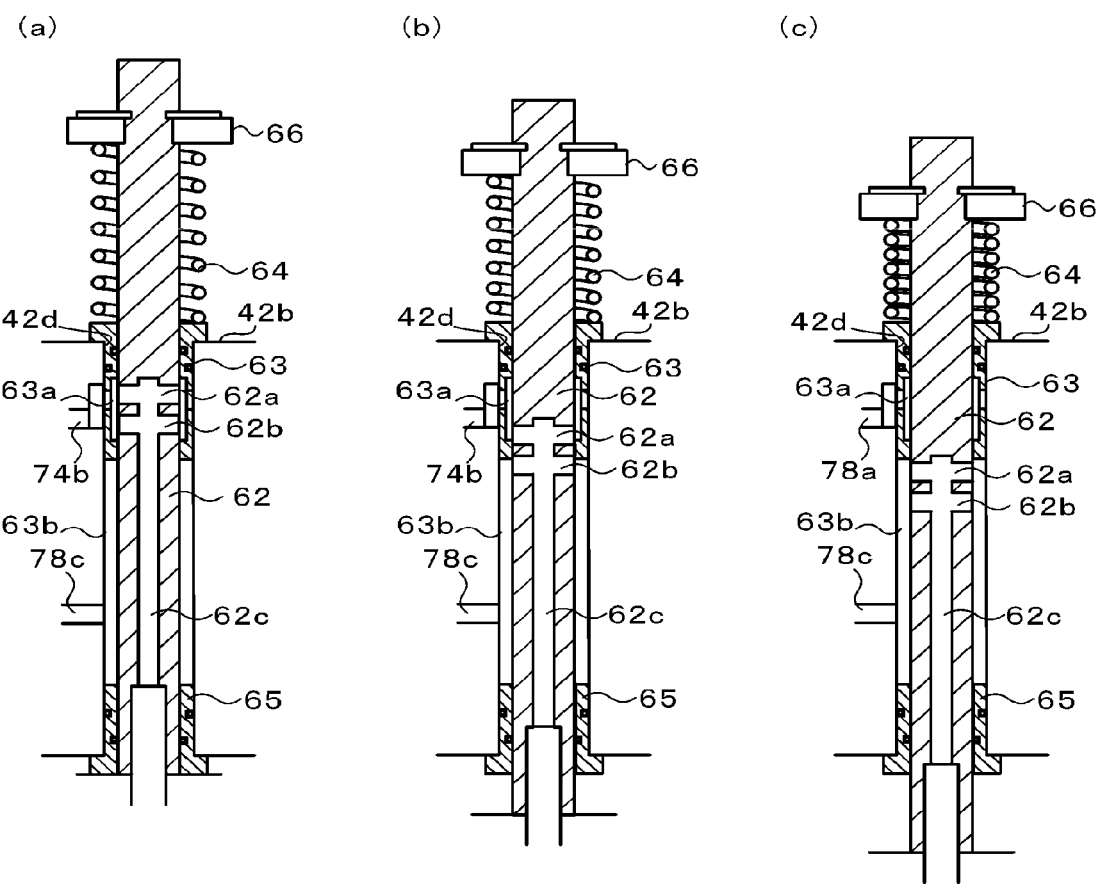
FIG. 7 illustrates states of supplying negative pressure and states of supplying positive pressure using negative pressure and positive pressure supplying device 70 to suction nozzle 60 that is lowered.
Figure 8:
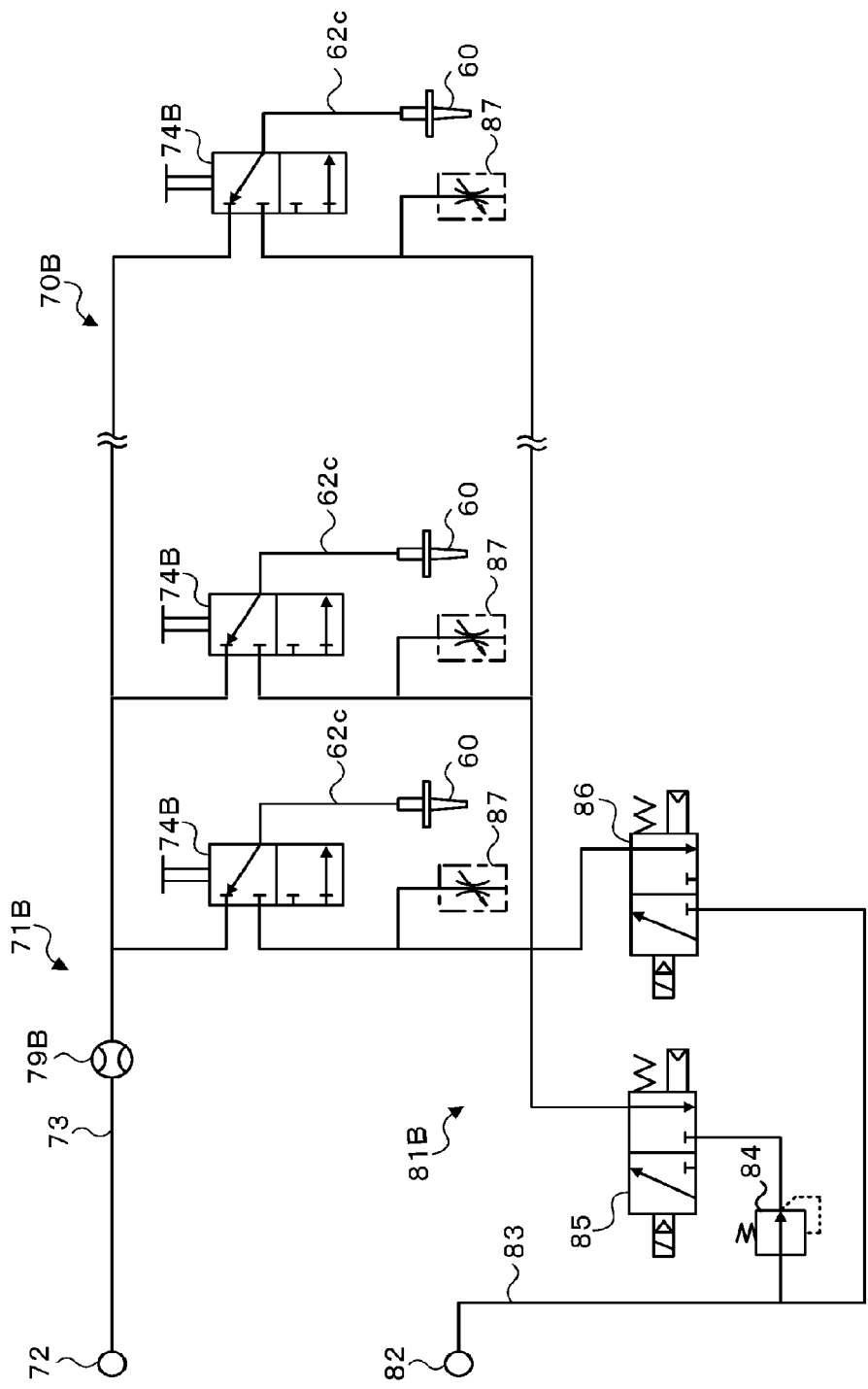
FIG. 8 schematically shows the configuration of negative pressure and positive pressure supply device 70B, which is used as a comparative example.
Figure 9:
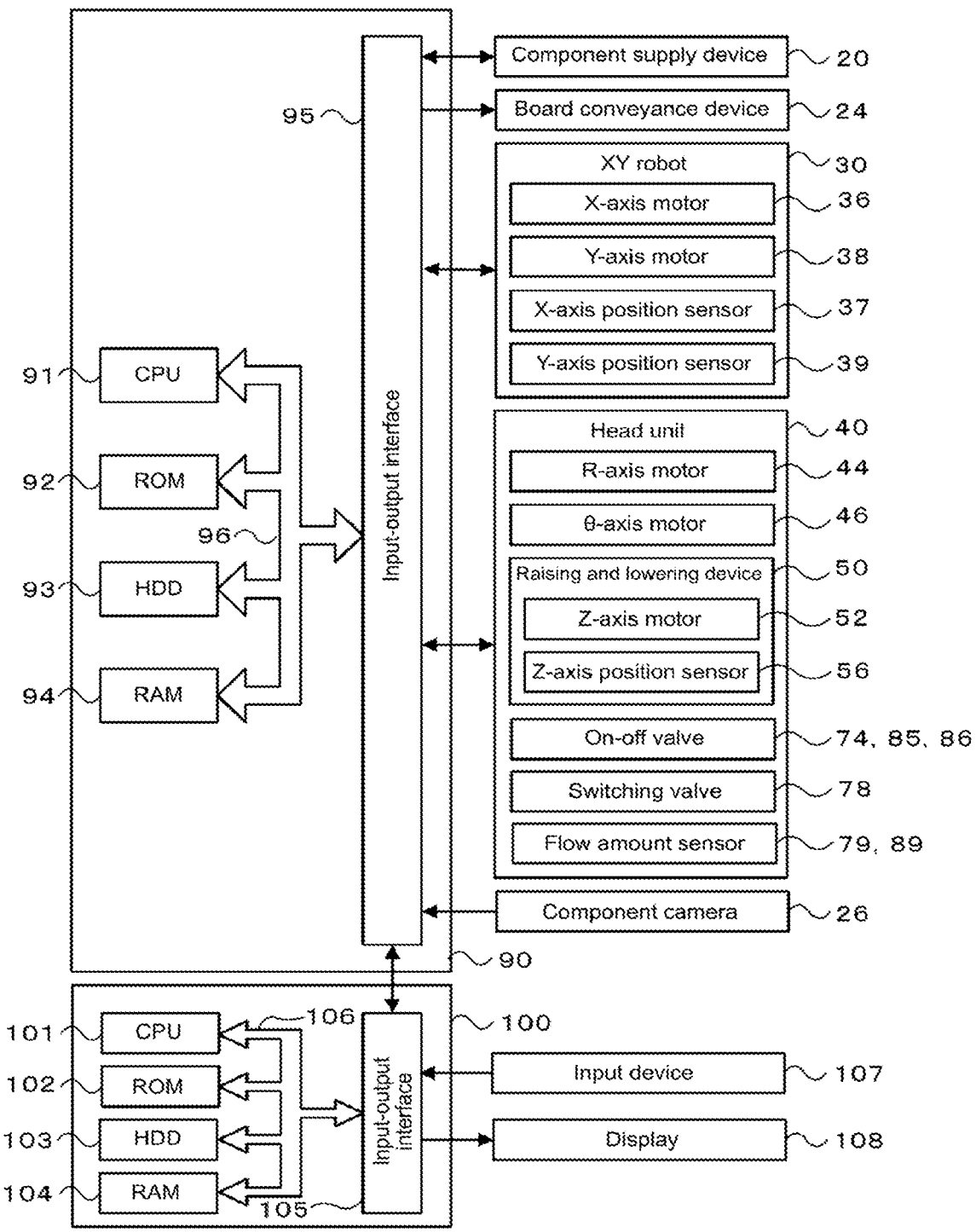
FIG. 9 schematically shows an outline of the configuration of management device 100 and control device 90 of component mounter 10.

FIG. 1 schematically shows the configuration of component mounter 10, which is an embodiment of the present disclosure; FIG. 2 schematically shows the overall configuration of head unit 40; FIG. 3 schematically shows the configuration of negative pressure and positive pressure supply device 70; FIG. 4 shows a cross section of rotary head 42; FIG. 5 shows cross sections at lines A-A, B-B, and C-C of FIG. 4; FIGS. 6 and 7 illustrate states of supplying negative pressure and states of supplying positive pressure using negative pressure and positive pressure supplying device 70 to suction nozzle 60 that is lowered; FIG. 8 schematically shows the configuration of negative pressure and positive pressure supply device 70B, which is used as a comparative example; FIG. 9 schematically shows an outline of the configuration of management device 100 and control device 90 of component mounter 10. Note that, in FIG. 1 the left-right direction is the X-axis direction, the front-rear direction is the Y-axis direction, and the up-down direction is Z-axis direction.

As shown in FIG. 1, viewed from the outside, component mounter 10 is provided with base 11 and frame 12 supported on base 11. As shown in FIG. 1, the configuration of component mounter 10 is provided with component supply device 20 that supplies components P to a component supply position, board conveying device 24 that conveys board S, head unit 40 that uses suction nozzle 60 to pick up a component P supplied to the component supply position and mount the component P on board S, XY robot 30 that moves head unit 40 in the XY-axis directions, and control device 90 (refer to FIG. 9) that performs overall device control. Component mounter 10 is also provided with items such as component camera 26 for imaging the orientation of component P picked up by suction nozzle 60, and a mark camera (not shown) provided on head unit 40 for reading positioning reference marks that are provided on board S. Component mounter 10 is connected to management device 100 such that two-way communication is possible.

As shown in FIG. 1, XY robot 30 is provided with X-axis guide rails 31, X-axis slider 32, Y-axis guide rails 33, and Y-axis slider 34. Y-axis guide rails 33 are provided as a left-right pair on an upper section of frame 12 extending in a front-rear direction (Y-axis direction). Y-axis slider 32 is attached to the left-right pair of Y-axis rails 33 and is moved in the Y-axis direction by the driving of Y-axis motor 38 (refer to FIG. 9). X-axis guide rails 31 are provided on a side surface of Y-axis slider 34 in a left-right direction (X-axis direction). Head unit 40 is attached to X-axis slider 32 and is moved in the X-axis direction by the driving of X-axis motor 36 (refer to FIG. 9). Accordingly, head unit 40 can be moved to any position in the XY plane by the driving of XY robot 30 (X-axis motor 36 and Y-axis motor 38). Also, XY robot 30 is provided with X-axis position sensor 37 (refer to FIG. 9) that detects a position of X-axis slider 32 in the X-axis direction, and Y-axis position sensor 39 (refer to FIG. 9) that detects the position of Y-axis slider 34 in the Y-axis direction.

As shown in FIG. 2, head unit 40 is provided with: suction nozzle 60; nozzle holder 62 that supports suction nozzle 60 in a removable manner; rotary head 42 on which are arranged multiple nozzle holders 62 in a circumferential direction with a center the same as the rotation center of the rotary head at a specified angle interval (for example, a 30-degree interval); and negative pressure and positive pressure supply device 70 (refer to FIG. 3) capable of supplying negative pressure or positive pressure to a suction opening of the multiple suction nozzles 60 held on each of the multiple nozzle holders 62. Also, head unit 40 is provided with: R-axis motor 44 as a driving-use actuator that rotates rotary head 42 so as to revolve suction nozzles 60 in a circumferential direction; θ-axis motor 46 that rotates (on its own axis) each nozzle holder 62; and raising and lowering device 50 that moves (raises and lowers) nozzle holder 62 in the Z-axis direction.

As shown in FIG. 2, rotary head 42 is provided with: shaft 42a; holder holding section 42b as a rotating body that holds the multiple nozzle holders 62 so as to be movable in the Z-axis direction, holder holding section 42b being formed as a rod with a larger diameter than shaft 42a; and support shaft 42c, which is inserted into the center of holder holding section 42b and shaft 42a, supports shaft 42a and holder holding section 42b so as to be rotatable around their own axes, and divides negative pressure paths 73 and 77, and positive pressure path 83 of negative pressure and positive pressure supply device 70, which are described later. Also, rotary head 42 includes: gear 43 provided coaxially with shaft 42a and supported so as to be freely rotatable with respect to shaft 42a; and gear 47 that rotates in accordance with the rotation of gear 43. Gear 43 is engaged with gear 45 attached to a rotation shaft of θ-axis motor 46, and gear 47 is engaged with gear 66 attached to each nozzle holder 62. Accordingly, head unit 40, by the driving of θ-axis motor 46, is able to adjust suction nozzle 60 held on each nozzle holder 62 to any rotation angle. Also, spring 64 is provided between a lower surface of gear 66 and an upper surface of holder holding section 42b. Spring 64 biases nozzle holder 62 upwards in the Z-axis direction.

Suction nozzle 60 picks up component P by contacting component P with a suction opening at the tip of suction nozzle 60 while negative pressure is supplied to the suction opening, and suction nozzle 60 releases component P being held by suction at the suction opening by supplying positive pressure to the suction opening.

Nozzle holder 62 is configured as a cylindrical tube member extending in the Z-axis direction, and nozzle passage 62c (refer to FIGS. 3 and 7) that connects to the suction opening of suction nozzle 60 is formed inside nozzle holder 62.

As shown in FIG. 2, raising and lowering device 50 is provided with Z-axis motor 52, and Z-axis slider 54 that is raised and lowered by the driving of Z-axis motor 52. Raising and lowering device 50, by lowering Z-axis slider 54, is able to push, from among the multiple nozzle holders 62, the nozzle holder 62 positioned below Z-axis slider 54 against the biasing force of spring 64. Conversely, raising and lowering device 50, by releasing the pushing on nozzle holder 62 by raising Z-axis slider 54, is able to raise the nozzle holder 62 by the biasing force of spring 64. In this manner, raising and lowering device 50 is configured to be able to raise and lower, from the multiple nozzle holders 62, only the nozzle holder 62 positioned below Z-axis slider 54. In the present embodiment, pickup operation is performed by driving Z-axis motor 52 to lower nozzle holder 62 until suction nozzle 60 contacts component P, and supplying negative pressure to the suction nozzle 60; mounting operation is performed by driving Z-axis motor 52 to lower the suction nozzle 60 holding the component P until the component P contacts board S, and supplying positive pressure to the suction nozzle 60. Note that, raising and lowering device 50 is also provided with Z-axis position sensor 56 (refer to FIG. 9) that detects the position of Z-axis slider 54 in the Z-axis direction.

As shown in FIG. 3, negative pressure and positive pressure supply device 70 is provided with first negative pressure supply unit 71, second negative pressure supply unit, and positive pressure supply unit 81. Details regarding negative pressure and positive pressure supply device 70 are described below with reference to FIGS. 3 to 7. Note that, nozzle holders 62 are omitted from FIGS. 4 and 5.

First negative pressure supply unit 71 is configured to supply negative pressure to nozzle passage 62c of, from the multiple nozzle holders 62, all the nozzle holders 62. As shown in FIG. 3, first negative pressure supply unit 71 is provided with negative pressure source 72 such as a negative pressure pump, negative pressure passage 73 connected to negative pressure source 72, and multiple on-off valves 74, which are arranged with respect to each of the multiple nozzle holders 62, that perform connecting and blocking of nozzle passage 62c and negative pressure passage 73. As shown in FIG. 4, negative pressure passage 73 is formed in a gap between the inner circumferential section of holder holding section 42b and the outer circumferential section of support shaft 42c. As shown in FIG. 3, the multiple on-off valves 74 each include negative-pressure-passage-side port 74a connected to negative pressure passage 73, and nozzle-passage-side port 74b connected to nozzle passage 62c. On-off valves 74 are switched to and from a state in which, when connected to the upper side, negative-pressure-passage-side port 74a and nozzle-passage-side port 74b are connected, and a state in which, when connected to the lower side, negative-pressure-passage-side port 74a and nozzle-passage-side port 74b are blocked from each other. As shown in FIGS. 4 and 5(a), negative-pressure-passage-side port 74a is usually connected to negative pressure passage 73 via a radial passage funned radiating from the center axis inside holder holding section 42c. As shown in FIG. 6, nozzle-passage-side port 74b is connected to nozzle passage 62c via through-holes 62a and 62b or blocked from nozzle passage 62c depending on the raising and lowering position of the corresponding nozzle holder 62.

Second negative pressure supply unit 75 is configured to supply negative pressure to nozzle passage 62c of, from the multiple nozzle holders 62, the nozzle holder 62 positioned at a revolving position at which the nozzle holder 62 can be lowered (that is, the nozzle holder 62 at the specified revolving position). As shown in FIG. 3, second negative pressure supply unit 75 is provided with: negative pressure source 76; negative pressure passage 77 connected to negative pressure source 76; multiple switching valves 78, which are arranged with respect to each of the multiple nozzle holders 62, that perform connecting and blocking of nozzle passage 62c and negative pressure passage 77; and flow amount sensor 79 for measuring the air flow amount inside negative pressure passage 77. Note that, negative pressure source 76 may be shared with negative pressure source 72, or may be provided separately to negative pressure source 72. As shown in FIG. 3, the multiple switching valves 78 are configured as three-port switching valves each including: negative-pressure-passage-side port 78a connected to negative pressure passage 77; positive-pressure-passage-side port 78b connected to positive pressure passage 83 that is described later; and nozzle-passage-side port 78b connected to nozzle passage 62c. Switching valves 78 are switched to and from: a state in which, when connected to the upper side, negative-pressure-passage-side port 78a and nozzle-passage-side port 78c are connected and positive-pressure-passage-side port 78b and nozzle-passage-side port 78c are connected; and a state in which, when connected to the lower side, negative-pressure-passage-side port 78a and nozzle-passage-side port 78c are blocked from each other and positive-pressure-passage-side port 78b and nozzle-passage-side port 78c are connected. In the present embodiment, switching valves 78 share use of a valve-driving actuator with on-off valves 74. Of course, separate valve-driving actuators may be provided for switching valves 78 and on-off valves 74. As shown in FIGS. 4, 5(b) and 5(c), negative-pressure-passage-side port 78a and positive-pressure-passage-side port 78b are respectively connected to negative pressure passage 77 and positive pressure passage 83 of only the port corresponding to the nozzle holder 62 that is at the revolving position and thus lowerable. As shown in FIG. 6, nozzle-passage-side port 78c is connected to nozzle passage 62c via through-hole 62b or blocked from nozzle passage 62c depending on the raising and lowering position of the corresponding nozzle holder 62.

Positive pressure supply unit 81 is configured to supply positive pressure to nozzle passage 62c of, from the multiple nozzle holders 62, the nozzle holder 62 positioned at a revolving position at which the nozzle holder 62 can be lowered. As shown in FIG. 3, positive pressure supply unit 81 is provided with: positive pressure source 82 such as a positive pressure pump; positive pressure passage 83 connected to positive pressure source 82; pressure adjusting valve 84 and on-off valve 85 provided on one of the dividing passages (mounting-use path) that divide from positive pressure passage 83 and converge again at positive pressure passage 83; on-off valve 86 provided on the other of the dividing passages (cleaning-use passage); control valve 87 for opening the system to the atmosphere provided at positive pressure passage 83 after the converge point; the above switching valve 78; and flow amount sensor 89 for measuring the air flow amount inside positive pressure passage 83. On-off valve 85 supplies or blocks positive pressure from positive pressure source 82 to positive-pressure-passage-side port 78b via pressure adjusting valve 84. On-off valve 86 supplies or blocks positive pressure from positive pressure source 82 to positive-pressure-passage-side port 78b directly without going via pressure adjusting valve 84. Positive-pressure-passage-side port 78b of switching valve 78, as described above, is connected only to the port corresponding to the nozzle holder 62 that is at the revolving position and is thus lowerable.

Here, as shown in FIG. 7, with holder holding section 42b, nozzle holder 62 is inserted into insertion hole 42d. Insertion hole 42d is formed with an inner diameter larger than the outer diameter of nozzle holder 62. Further, with insertion hole 42d, cylindrical tube members 63 and 65 with flanges are respectively attached to a lower end section and an upper end section of insertion hole 42d, and nozzle holder 62 is inserted through the inner circumferential section of cylindrical tube members 63 and 65 such that nozzle holder 62 is supported to be capable of being raised and lowered. The space (second cylindrical tube space 63b) enclosed by nozzle holder 62, insertion hole 42d, and cylindrical tube members 63 and 65 is connected to nozzle-passage-side port 78c of switching valve 78 described above. Further, cylindrical tube member 63 attached to the upper end section of insertion hole 42d has an axial-direction central section inner circumference with a diameter that expands larger than the outer diameter of nozzle holder 62. The space (first cylindrical tube space 63a) formed by the expansion of the inner circumference of cylindrical tube member 63 is connected to nozzle-passage-side port 74b of on-off valve 74 described above via a through-hole that pierces cylindrical tube member 63 in the diameter direction. For nozzle holders 62, two through-holes (first through-hole 62a and second through-hole 62b) that pierce in the diameter direction to connect nozzle passage 62c extending in the axial direction (Z-axis direction) are formed separated by a specified interval in the axial direction.

Here, it is assumed that on-off valve 74 is connecting negative-pressure-passage-side port 74a and nozzle-passage-side port 74b, and that switching valve 78 is connecting negative-pressure-passage-side port 78a and nozzle-passage-side port 78c and blocking positive-pressure-passage-side port 78b and nozzle-passage-side port 78c from each other. In this case, when nozzle holder 62 is raised, first through-hole 62a and second through-hole 62b are both connected to first cylindrical tube space 63a. In this state, nozzle-passage-side port 74b is connected to nozzle passage 62c via first cylindrical tube space 63a and first and second through-holes 62a and 62b, and nozzle-passage-side port 78c and nozzle passage 62c are blocked from each other (refer to FIGS. 6[a] and 7[a]). Accordingly, the negative pressure from negative pressure source 72 (negative pressure passage 73) is supplied to the suction opening of suction nozzle 60. When nozzle holder 62 is lowered from this state, first through-hole 62a is connected to first cylindrical tube space 63a, and second through-hole 62b is connected to second cylindrical tube space 63b. In this state, nozzle-passage-side port 74b is connected to nozzle passage 62c via first cylindrical tube space 63a and first through-holes 62a, and nozzle-passage-side port 78c is connected to nozzle passage 62c via second cylindrical tube space 63b and second through-hole 62b (refer to FIGS. 6[b] and 7[b]). Accordingly, the negative pressure from negative pressure source 72 (negative pressure passage 73) and the negative pressure from negative pressure source 76 (negative pressure passage 77) is supplied to the suction opening of suction nozzle 60. Also, when nozzle holder 62 is lowered further, through-holes 62a and 62b are connected to second cylindrical tube space 63b. In this state, nozzle-passage-side port 74b and nozzle passage 62c are blocked from each other, and nozzle-passage-side port 78c is connected to nozzle passage 62c via second cylindrical tube space 63b and first and second through-holes 62a and 62b (refer to FIGS. 6[c] and 7[c]). Accordingly, the negative pressure from negative pressure source 76 (negative pressure passage 77) is supplied to the suction opening of suction nozzle 60.

Next, it is assumed that, in a state with first and second through-holes 62a and 62b connected to second cylindrical tube space 63b (the state shown in FIGS. 6[c] and 7[c]), on-off valve 74 is blocking negative-pressure-passage-side port 74a and nozzle-passage-side port 74b from each other, and that switching valve 78 is switched to a state blocking negative-pressure-passage-side port 78a and nozzle-passage-side port 78c from each other and connecting positive-pressure-passage-side port 78b and nozzle-passage-side port 78c. In this case, as shown in FIG. 6(d), negative pressure from negative-pressure-passage-side port 74a is blocked, and instead positive pressure from positive-pressure-passage-side port 78b is supplied to the suction opening of suction nozzle 60.

In this manner, negative pressure and positive pressure supply device 70 connects negative pressure passage 73 to nozzle passage 62c of, from among the multiple nozzle holders 62, all the nozzle holders 62, and connects either of negative pressure passage 77 or positive pressure passage 83 to nozzle, passage 62c of the nozzle holder 62 that is lowered. Accordingly, because negative pressure passage 77 is connected to only the suction opening of the suction nozzle 60 that is performing pickup operation, it is possible to accurately detect the flow amount of negative pressure passage 77 in accordance with pickup operation by detecting the air flow amount using flow amount sensor 79 provided in negative pressure passage 77. Also, because positive pressure passage 83 is connected to only the suction opening of the suction nozzle 60 that is performing mounting operation, it is possible to accurately detect the flow amount of positive pressure passage 83 in accordance with mounting operation by detecting the air flow amount using flow amount sensor 89 provided in positive pressure passage 83. That is, it is possible to more accurately determine the state of suction nozzle 60 during pickup operation and mounting operation.

In contrast, positive pressure and negative pressure supply device 70B used as a comparative example is provided with: negative pressure supply unit 71B that is similar to first negative pressure supply unit 71; positive pressure unit 81B that is similar to positive pressure unit 81; and switching valve 74B that selectively connects negative pressure passage 73 of negative pressure supply unit 71B or positive pressure passage 83 of positive pressure unit 81B to nozzle passage 62c. This means, nozzle passage 62c is supplied with negative pressure from negative pressure supply unit 71B or positive pressure from positive pressure supply unit 81B regardless of the raising and lowering of suction nozzle 60 (nozzle holder 62). With such a positive pressure and negative pressure supply device 70B used as a comparative example, by providing flow amount sensor 79B in negative pressure passage 73, it is possible to detect a flow amount of negative pressure passage 73 in accordance with pickup operation using flow amount sensor 79B. However, because negative pressure passage 73 is supplying negative pressure to all suction nozzles 60, the state of suction nozzle 60 performing the pickup operation is greatly affected by whether there are air leaks or missing components at the other suction nozzles 60. Thus, there are cases in which it is not possible to accurately obtain the flow amount of negative pressure passage 73 in accordance with pickup operation using flow amount sensor 79B. Also, even when providing a pressure sensor instead of flow amount sensor 79B in negative pressure passage 73, in a similar manner, there are cases in which it is not possible to accurately obtain the negative pressure of negative pressure passage 73 in accordance with pickup operation.

As shown in FIG. 9, control device 90 is provided with CPU 91, ROM 92, HDD 93, RAM 94, and output-input interface 95. These items are electrically connected by bus 96. Various signals from items such as component camera 26, a mark camera, flow amount sensors 79 and 89, X-axis position sensor 37, Y-axis position sensor 39, and Z-axis position sensor 56 are entered into control device 90 via input-output interface 95. On the other hand, control device 90 outputs drive signals to items such as component supply device 20, board conveying, device 24, XY robot 30 (X-axis motor 36 and Y-axis motor 38), head unit 40 (R-axis motor 44, θ-axis motor 46, Z-axis motor 52, on-off valves 74, 85, and 86, switching valve 78, and the like) via input-output interface 95.

Management device 100, for example, is a general purpose computer provided with, as shown in FIG. 9, items such as CPU 101, ROM 102, HDD 103, RAM 104, and input-output interface 105. These items are electrically connected by bus 106. Management computer 100 receives input signals from input device 107 such as a mouse or keyboard via input-output interface 105. Also, management device 100 outputs image signals to display 108 via input-output interface 105. HDD 103 memorizes a production plan of board S. Here, the board production plan is a plan that defines which components should be mounted on the board and in what order by component mounter 10, along with how many boards S mounted with components P in this manner are to be manufactured, and so on. Included in the production plan are items such as board data related to the board S to be produced, head data related to head unit 40 to be used, nozzle data related to the suction nozzles 60 to be used, component data related to the components P to be mounted, and target mounting positions of each component P. Management device 100 creates a production plan based on data entered by an operator via input device 107, and sends the created production plan to each component mounter 10.

Figure 10:
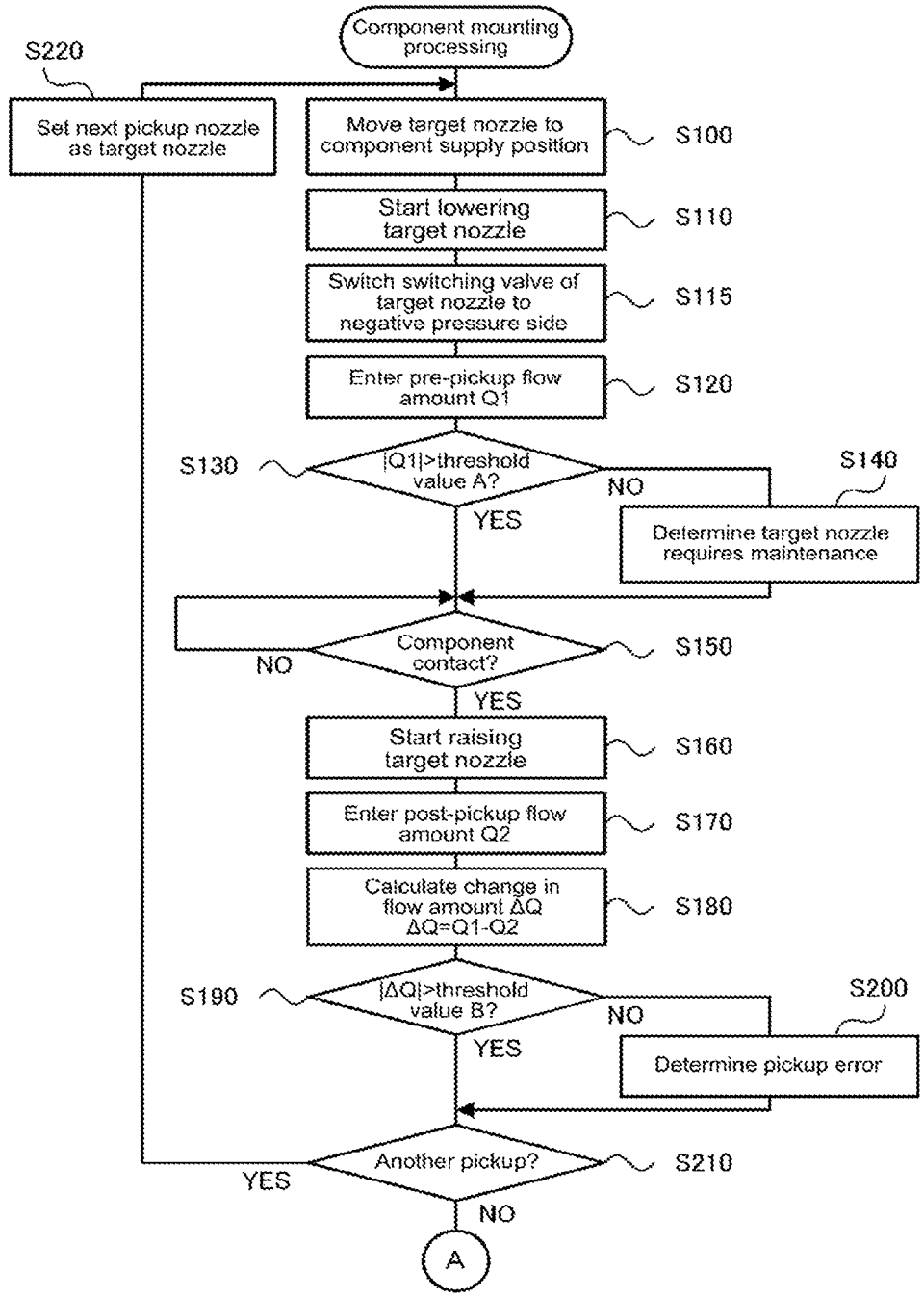
FIG. 10 is a flowchart showing an example (a first half) of component mounting processing performed by CPU 91 of control device 90.
Figure 11:
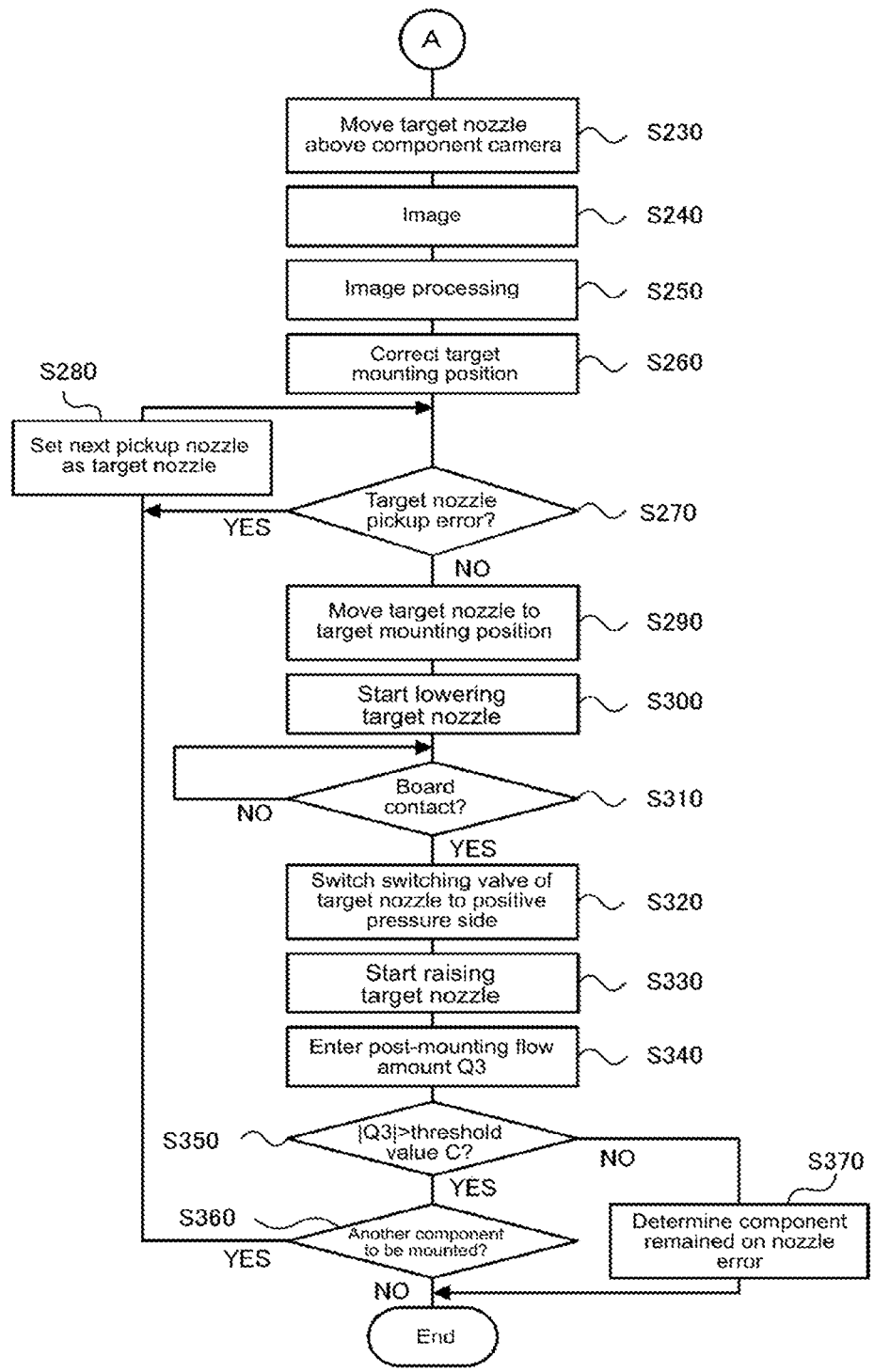
FIG. 11 is a flowchart showing an example (a second half) of component mounting processing performed by CPU 91 of control device 90.

Described next is operation of component mounter 10 configured as given above, in particular, operation when picking up a component P supplied to the component supply position by component supply device 20. FIGS. 10 and 11 are flowcharts illustrating an example of a component mounting process performed by CPU 91 of control device 90. This processing is performed when a mounting command including the production plan is issued from management device 100.

When component mounting processing is performed, CPU 91 of control device 90, first, performs drive control of XY robot 30 (X-axis motor 36 and Y-axis motor 38) and R-axis motor 44 such that the position in the XY-axis directions of, among the multiple suction nozzles 60, the suction nozzle 60 at the revolving position at which lowering is possible matches the XY coordinates of the component supply position (S100). Then, CPU 91 drive controls raising and lowering device 50 (Z-axis motor 52) such that the target nozzle starts to be lowered (S110), and switches switching valve 78 to the negative pressure side such that nozzle-passage-side port 74b of the target nozzle is connected to negative-pressure-passage-side port 74a (negative pressure path 77) (S115).

CPU 91, when the target nozzle is lowered, after the negative pressure passage that connects to the suction opening (nozzle passage 62c) of the target nozzle has been changed from negative pressure passage 73 to negative pressure passage 77, but before the target nozzle has contacted component P, receives an air flow amount from flow amount sensor 79 provided in negative pressure passage 77 as pre-pickup flow amount Q1 (S120), and determines whether the absolute value of the received pre-pickup flow amount Q1 is larger than threshold value A (S130). As given above, when the target nozzle is lowered, the suction opening (nozzle passage 62c) of the target nozzle is switched from a state connected to negative pressure passage 73 to a state connected to negative pressure passage 77. Negative pressure passage 73 is connected to the suction openings of all the suction nozzles 60, but negative pressure passage 70 is connected to only the suction opening of the target nozzle. Accordingly, by providing flow amount sensor 79 in negative pressure passage 77, it is possible to accurately detect the air flow amount sucked from the suction opening of the target nozzle that passes through negative pressure passage 77 without being influenced by factors such as air leaks or missing components at other suction nozzles 60. Here, threshold value A is for determining whether air passages such as nozzle passage 62c or the suction opening of the target nozzle are blocked by items such as dust or foreign matter. CPU 91, when determining that the absolute value of pre-pickup flow amount Q1 is equal to or less than threshold value A, determines that maintenance is required for the target nozzle (S140), and when determining that the absolute value of pre-pickup flow amount Q1 is greater than threshold value A, determines that maintenance is not required for the target nozzle. Note that, this determining operation may be performed before starting production of board S, without performing pickup of component P. In this manner, it is possible to detect any defective nozzles before starting production of board S, thus preventing a drop in production efficiency.

Next, CPU 91 waits until contact (pickup) of component P by the target nozzle is detected using a touch sensor, which is not shown (S150). CPU 91, when determining that the target nozzle has contacted (picked up) the component P, performs drive control of raising and lowering device 50 (Z-axis motor 52) so as to start the raising of the target nozzle (S160). Here, when the target nozzle (nozzle holder 62) is raised, the negative pressure passage connected to nozzle passage 62c of the target nozzle is switched from negative pressure passage 77 to negative pressure passage 73. The switching between negative pressure passages 73 and 77, in the present embodiment, is performed via a state in which both negative pressure passages 73 and 77 are connected to nozzle passage 62c. Thus, when switching the connection to nozzle passage 62c between negative pressure passages 73 and 77 in accordance with the raising of the target nozzle, leaking of negative pressure at the target nozzle is curtailed, thus preventing the component P being held by the target nozzle from falling. Also, CPU 91, before the negative pressure passage connected to the suction opening (nozzle passage 62c) of the target nozzle is switched from negative pressure passage 77 to negative pressure passage 73, receives an air flow amount from flow amount sensor 79 as post-pickup flow amount Q2 (S170), calculates flow amount change ΔQ by subtracting post-pickup flow amount Q2 from pre-pickup flow amount Q1 (S180), and determines whether the absolute value of flow amount change ΔQ is larger than threshold value B (S190). Here, threshold value B is for determining whether component P is being held correctly without air leaks or the like occurring at the target nozzle. That is, the suction opening of the target nozzle changes from an open state to a closed state when component P is being held correctly. Thus, the absolute value of flow amount change ΔQ is large when component P is being held correctly by the suction opening, and is small when component P is not being held correctly by the suction opening. CPU 91, if determining that the absolute value of flow amount change ΔQ is larger than threshold value B, determines that the component P is being held correctly by the target nozzle, and if determining that the absolute value of flow amount change ΔQ is equal to or less than threshold value B, determines a pickup error has occurred in which component P is not being held correctly by the target nozzle (S200).

Then, CPU 91 determines whether there is another suction nozzle 60 that should pick up a component P (S210). CPU 91, if determining that there is another suction nozzle 60 that should pick up a component P, performs drive control of R-axis motor 44 to revolve that suction nozzle 60 as the target nozzle to the position at which lowering is possible (S220), returns to S100, and repeats S100 to S210. If determining in S210 that there is no suction nozzle 60 that should click up a component P, CPU 91 proceeds to S230.

Next, CPU 91 performs drive control of XY robot 30 to move the suction nozzles 60 holding the components P above component camera 26 (S230). Then, CPU 91 uses component camera 26 to perform imaging (S240), processes the captured image (S250), and corrects the target mounting positions based on the pickup position of the components P (S260).

CPU 91, when correcting the target mounting position, determines whether the target nozzle is a nozzle for which a pickup error was determined (S270). CPU 91, if determining that the target nozzle is a nozzle for which an error occurred, revolves the next suction nozzle 60 to the position at which lowering is possible as the target nozzle (S280), and then determines whether that target nozzle is a nozzle for which an error occurred (S270). CPU 91, if determining that the target nozzle is not a nozzle for which an error occurred, performs drive control of XY robot 30 such that the position of the target nozzle in the XY-axis directions matches the XY coordinates of the target mounting position (S290), and performs drive control of raising and lowering device 50 so as to start lowering the target nozzle (S300). Here, when the target nozzle (nozzle holder 62) is lowered, the negative pressure passage connected to nozzle passage 62c of the target nozzle is switched from negative pressure passage 73 to negative pressure passage 77. As above, the switching between negative pressure passages 73 and 77, in the present embodiment, is performed via a state in which both negative pressure passages 73 and 77 are connected to nozzle passage 62c. Thus, when switching the connection to nozzle passage 62c between negative pressure passages 73 and 77 in accordance with the lowering of the target nozzle, leaking of negative pressure at the target nozzle is curtailed, thus preventing the component P being held by the target nozzle from falling. Also, CPU 91 determines whether the component P being held by the target nozzle has contacted board S using a touch sensor, which is not shown (S310). CPU 91, if determining that the component P has contacted the board S, performs drive control of switching valve 78 and on-off valves 85 and 86 such that nozzle passage 62c of the target nozzle is connected to positive pressure source 82 via pressure adjusting valve 84, so as to mount the component P on the board S (S320).

CPU 91, after component P has been mounted on board S, performs drive control of raising and lowering device 50 (Z-axis motor 52) so as to start raising of the target nozzle (S330). Then, CPU 91, as the connection between positive pressure passage 83 and nozzle passage 62c is being maintained, receives an air flow amount detected by flow amount sensor 89 as post-mounting flow amount Q3 (S340), and determines whether the absolute value of post-mounting flow amount Q3 is larger than threshold value C (S350). Here, threshold value C is for determining whether an error has occurred in which the component P remained on the target nozzle without being released when the target nozzle was raised after attempting to perform mounting of the component P on board S. That is, the suction opening of the target nozzle changes from a closed state to an open state when the component P is mounted on board S and separated from the suction opening. Thus, the absolute value of post-mounting flow amount Q3 is large when component P has separated from the suction opening, and is small when component P remains held at the suction opening. CPU 91, if determining that post-mounting flow amount Q3 is larger than threshold value C, determines that the component P was correctly mounted on board S, and then determines whether there is another component P to be mounted (S360). CPU 91, if determining that there is another component P to be mounted, revolves the next suction nozzle 60 to the position at which lowering is possible as the target nozzle (S280), and returns to S270. On the other hand, CPU 91, if determining that there is no other component P to be mounted, ends component mounting processing. Further, CPU 91, if determining in S350 that post-mounting flow amount Q3 is equal to or less than threshold value C, determines that an error occurred in which the component remained on the suction nozzle (S370), and ends mounting processing.

Figure 12:
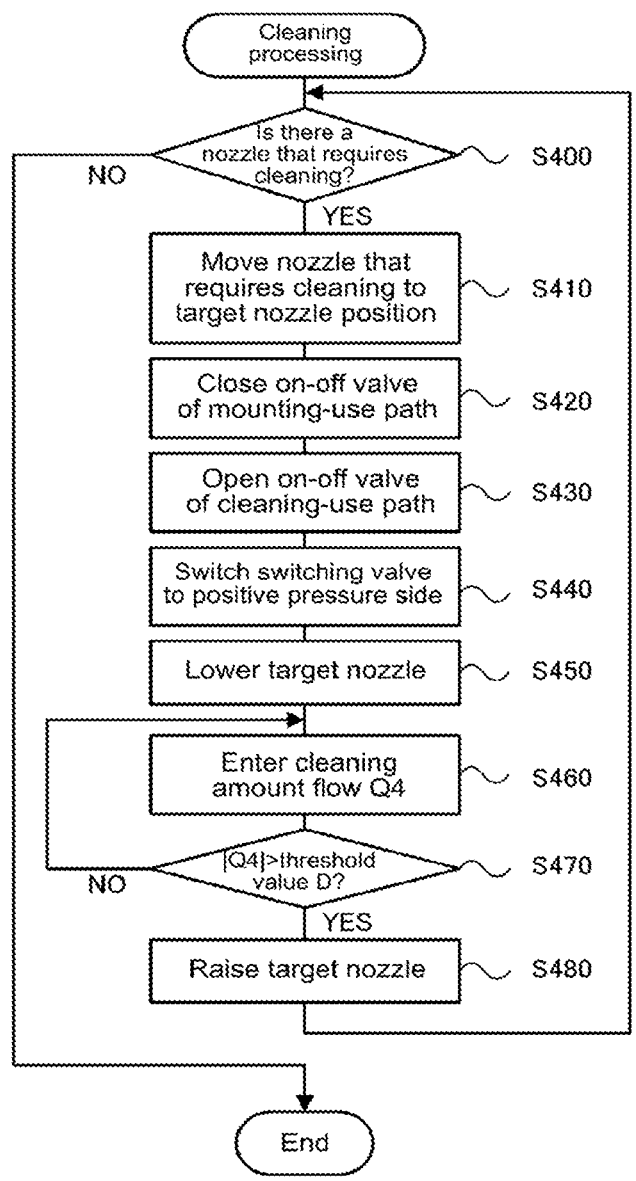
FIG. 12 is a flowchart showing an example of cleaning processing performed by CPU 91 of control device 90.

Described next is operation performed when performing maintenance of rotary head 42 (suction nozzle 60, nozzle holder 62). FIG. 12 is a flowchart showing an example of cleaning processing performed by CPU 91 of control device 90. This processing is performed during spare time in which pickup operation and mounting operation are not being performed, and is performed based on a separate instruction from an operator or management device 100.

When cleaning processing is performed, CPU 91, first, determines whether there is a suction nozzle 60 for which maintenance was determined to be necessary (a nozzle that requires cleaning) in S140 of component mounting, processing (S400). CPU 91, if determining that there are no nozzles that require cleaning, ends cleaning processing. On the other hand, if determining that there is a nozzle that requires cleaning, CPU 91 performs drive control of R-axis motor 44 to revolve the nozzle that requires cleaning as the target nozzle to the position at which lowering is possible (S410). Then, CPU 91, closes on-off valve 85 to block the mounting-use path that connects positive pressure source 82 to positive-pressure-passage-side port 78b via pressure adjusting valve 84 (S420), and opens on-off valve 86 to connect the cleaning-use path that directly connects positive pressure source 82 to positive-pressure-passage-side port 78b (S430). Also, CPU 91 switches switching valve 78 such that positive-pressure-passage-side port 78b is connected to nozzle-passage-side port 78c (S440).

Then, CPU 91 performs drive control of raising and lowering device 50 so as to lower the target nozzle (S450). As described above, when the target nozzle is lowered, nozzle passage 62c of the target nozzle is connected to nozzle-passage-side port 78c. Thus, positive pressure from positive pressure source 82 is supplied to nozzle passage 62 and the suction opening of the target nozzle via on-off valve 86 (cleaning-use path) and switching valve 78 (positive-pressure-passage-side port 78b and nozzle-passage-side port 78c) without the pressure being adjusted (reduced) by pressure adjusting valve 84. By this, foreign matter and dust inside paths such as nozzle passage 62c and the suction opening are blown away, clearing any blockages inside the paths.

Then, CPU 91 receives an air flow amount from flow amount sensor 89 provided in positive pressure passage 83 as cleaning flow amount Q4 (S460), and waits until the absolute value of the received cleaning flow amount Q4 is larger than threshold value D (S470). Here, threshold value D is for determining whether blockages inside paths such as nozzle passage 62c and the suction opening have been cleared. CPU 91, if determining that cleaning, flow amount Q4 if larger than threshold value D, determines that cleaning of the target nozzle is complete, performs drive control of raising and lowering device 50 so as to raise the target nozzle (S480), returns to S400, and determines whether there is still a nozzle that requires cleaning. CPU 91, if determining that there is a nozzle that requires cleaning, repeats processing of S410 to S480 on the nozzle that requires cleaning as the target nozzle, or, if determining that there are no nozzles that require cleaning, ends cleaning processing. Note that, in the present embodiment, CPU 91 determines that cleaning is complete if the absolute value of cleaning flow amount Q4 is larger than threshold value D, but CPU 91 may determine that cleaning is complete after a specified time has elapsed since the starting of cleaning.

Correspondences between constituent elements of the present embodiment and constituent elements of the disclosure will be clarified here. Component mounter 10 of the present embodiment corresponds to a "component mounter" of the present disclosure; suction nozzle 60 corresponds to a "suction nozzle", rotary head 42 corresponds to a "rotary head"; XY robot 30 corresponds to a "moving device", R-axis motor 44 corresponds to a "rotating device"; raising and lowering device 50 corresponds to a "raising and lowering device"; first negative pressure supply unit 71 corresponds to a "first negative pressure unit"; second negative pressure supply unit 75 corresponds to a "second negative pressure unit"; nozzle-passage-side port 74*b* corresponds to a "first port"; nozzle-passage-side port 78*c* corresponds to a "second port". Also, flow amount sensor 79 corresponds to a "negative pressure supply state detecting sensor", and CPU 91 that performs processing of S170 to S200 of component mounting processing corresponds to a "pickup state determining means". Further, CPU 91 that performs processing of S130 and S140 of component mounting processing corresponds to a "maintenance determining means". Also, positive pressure unit 81 corresponds to a "positive pressure unit", and switching valve 78 corresponds to a "switching valve".

Component mounter 10 of the embodiment described above, separately to first negative pressure supply unit 71 that supplies negative pressure to the suction openings of all the suction nozzles 60, is provided with second negative pressure supply unit 75 that supplies negative pressure to the suction nozzle 60 (target nozzle) held by the nozzle holder 62 that is lowerable when that nozzle holder 62 is lowered. Accordingly, when performing pickup operation and mounting operation using the suction nozzle 60, the state of the suction nozzle 60 is not affected by the state of the other suction nozzles 60.

Also, component mounter 10 of the present embodiment, when raising and lowering the target nozzle, switches the negative pressure supply unit (first negative pressure supply unit 71 and second negative pressure supply unit 75) that supplies negative pressure to the target nozzle via a state in which negative pressure is supplied from both first negative pressure supply unit 71 and second negative pressure supply unit 75. Thus, when switching the negative pressure supply unit that supplies negative pressure to the target nozzle, leaking of negative pressure at the target nozzle is curtailed, thus preventing the component P being held by the target nozzle from falling.

Further, component mounter 10 of the present embodiment is provided with flow amount sensor 79 in negative pressure passage 77 of second negative pressure supply unit 75, and detects an air flow amount of suction nozzle 60 performing pickup operation (the target nozzle) using flow amount sensor 79. Accordingly, it is possible to more accurately determine the pickup state of component P by the target nozzle that is performing pickup operation without being affected by the state of other suction nozzles 60.

Also, component mounter 10 of the present embodiment is provided with positive pressure supply unit 81 that supplies positive pressure to the suction nozzle 60 (target nozzle) held by the nozzle holder 62 that is lowerable when that nozzle holder 62 is lowered, and uses switching valve 78 to switch between supplying positive pressure to the target nozzle from positive pressure supply unit 81 and supplying negative pressure to the target nozzle from second negative pressure supply unit 75. Accordingly, when performing mounting operation using the suction nozzle 60, the state of the suction nozzle 60 is not affected by the state of the other suction nozzles 60.

Further, component mounter 10 of the present embodiment is provided with flow amount sensor 89 in positive pressure passage 83 of positive pressure supply unit 81, and detects an air flow amount of the suction nozzle 60 (target nozzle) performing mounting operation using flow amount sensor 89. Accordingly, it is possible to more accurately determine the mounting state of component P by the target nozzle that is performing mounting operation.

Meanwhile, it goes without saying that the disclosure is not limited to the above-mentioned embodiment and various embodiments may be applied within the technical scope of the disclosure.

Figure 13:
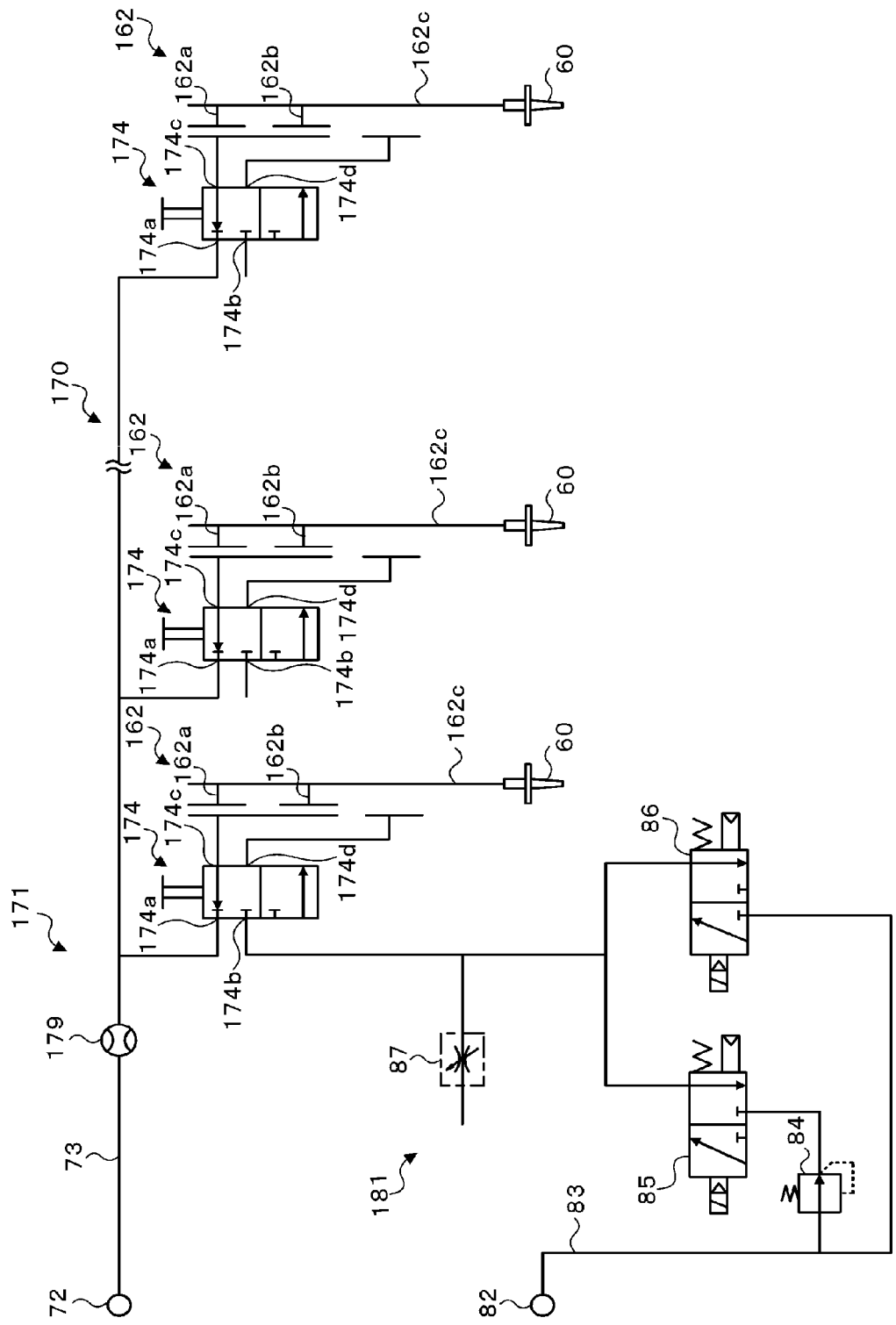
FIG. 13 schematically shows the configuration of negative pressure and positive pressure supply device 170, which is an alternative example.

For example, in the embodiment described above, component mounter 10 is provided with first negative pressure supply unit 71, second negative pressure supply unit 75, and positive pressure supply unit 81 as negative pressure and positive pressure supply device 70, and uses switching valve 78 to switch between supplying negative pressure from second negative pressure supply unit 75 to nozzle passage 62*c* of the nozzle holder 62 that is lowerable when that nozzle holder 62 is lowered, and supplying positive pressure from positive pressure supply unit 81. However, instead of negative pressure and positive pressure supply device 70, a component mounter may be provided with an alternative example device, positive pressure and negative pressure supply device 170 that does not have second negative pressure supply unit 75. FIG. 13 schematically shows the configuration of negative pressure and positive pressure supply device 170, which is an alternative example. As shown, alternative example positive pressure and negative pressure supply device 170 is provided with negative pressure supply unit 171 that is similar to first negative pressure supply unit 71, and positive pressure supply unit 181 that is similar to positive pressure supply unit 81, and multiple switching valves 174 that provided for each of the multiple nozzle holders 62, which switch the passage connected to nozzle passage 162 between negative pressure passage 73 of negative pressure supply unit 171 and positive pressure passage 83 of positive pressure supply unit 181. The multiple switching valves 174 are configured as four-port switching valves each including: negative-pressure-passage-side port 174*a* connected to negative pressure passage 73; positive-pressure-passage-side port 174*b* connected to positive pressure passage 83; and first nozzle-passage-side port 174*c* and second nozzle-passage-side port 174*d* connected to nozzle passage 162*c*. Switching valves 174 are switched to and from: a state in which, when connected to the upper side, negative-pressure-passage-side port 174*a* and first nozzle-passage-side port 174*c* are connected and positive-pressure-passage-side port 174*b* and second nozzle-passage-side port 174*d* are connected; and a state in which, when connected to the lower side, negative-pressure-passage-side port 174*a* and first nozzle-passage-side port 174*c* are blocked from each other and positive-pressure-passage-side port 174*b* and second nozzle-passage-side port 78*c* are connected. Negative-pressure-passage-side port 174*a* is usually connected to negative pressure passage 73. Positive-pressure-passage-side port 174*b* is connected only to the port corresponding to the nozzle holder 62 that is at the revolving position and is thus lowerable. First nozzle-passage-side port 174*c* is connected to nozzle passage 162*c* via through-hole 162*a* regardless of the raising and lowering position of nozzle holder 62. Second nozzle-passage-side port 174*d* is connected to nozzle passage 162*c* via through-holes 162*b* or blocked from nozzle passage 162*c* depending on the raising and lowering position of the nozzle holder 62.

Figure 14:
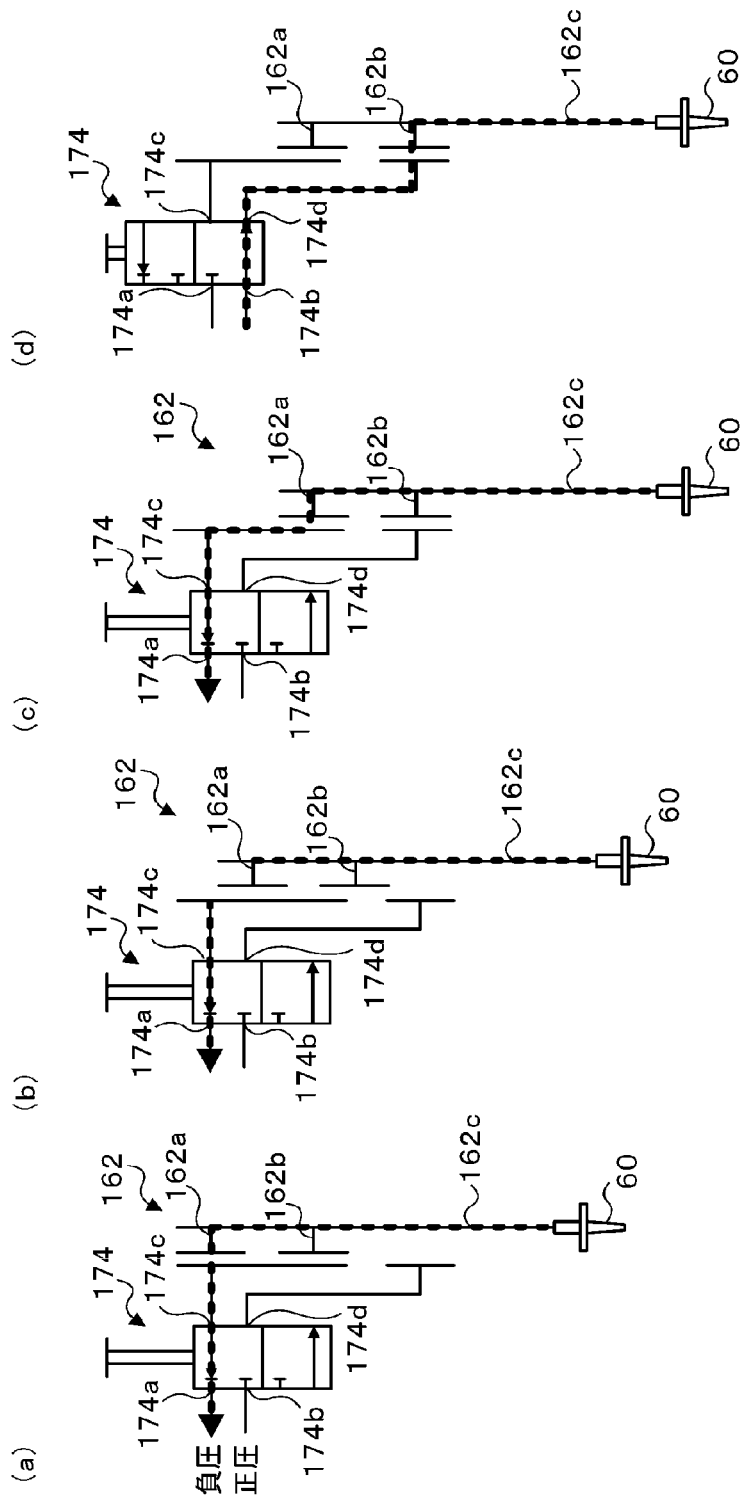
FIG. 14 illustrates states of supplying negative pressure and states of supplying positive pressure using negative pressure and positive pressure supplying device 170 to suction nozzle 60 that is lowered.
Figure 15:
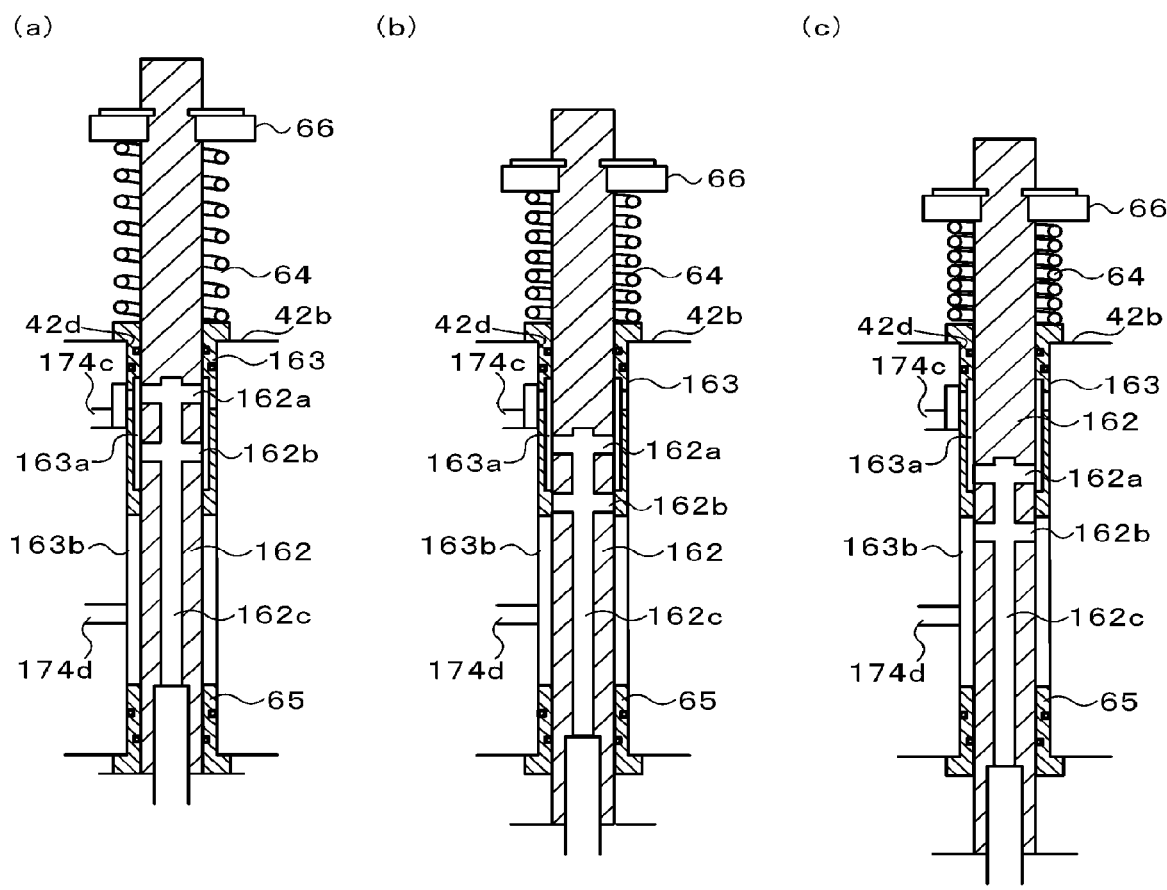
FIG. 15 illustrates states of supplying negative pressure and states of supplying positive pressure using negative pressure and positive pressure supplying device 170 to suction nozzle 60 that is lowered.

FIGS. 14 and 15 illustrate states of supplying negative pressure and states of supplying positive pressure using negative and positive pressure supplying device 170 to suction nozzle 60 that is lowered. Here, as shown in FIG. 15, cylindrical tube member 163 attached to the upper end section of insertion hole 42*d* of holder holding section 42b is longer in the axial direction (raising and lowering direction) than cylindrical tube member 63 of the first embodiment. Also, first cylindrical tube space 163a formed by the expansion of the inner circumference of Cylindrical tube member 163 is longer in the axial direction than first cylindrical tube space 63a of the first embodiment, and second cylindrical space 163b enclosed by nozzle holder 162, insertion hole 42d, and cylindrical tube members 163 and 65 is narrower in the axial direction than second cylindrical tube space 63b of the first embodiment. Further, for nozzle holders 162, two through-holes (first through-hole 162a and second through-hole 162b) that pierce in the diameter direction to connect nozzle passage 162c extending in the axial direction (Z-axis direction) in the nozzle holder are formed separated by a specified interval in the axial direction that is wider than that of through-holes 62a and 62b of the first embodiment.

Here, it is assumed that switching valve 174 is connecting negative-pressure-passage-side port 174a and first nozzle-passage-side port 174c, and blocking positive-pressure-passage-side port 174b and nozzle-passage-side port 174d from each other. In this case, when nozzle holder 162 is raised, first through-hole 162a and second through-hole 162b are both connected to first cylindrical tube space 163a. In this state, first nozzle-passage-side port 174c is connected to nozzle passage 162c via first cylindrical tube space 163a and first and second through-holes 162a and 162b, and second nozzle-passage-side port 174d and nozzle passage 162c are blocked from each other (refer to FIGS. 14[a] and 15[a]). Accordingly, the negative pressure from negative pressure source 72 (negative pressure passage 73) is supplied to the suction opening of suction nozzle 60. When nozzle holder 162 is lowered from this state, first cylindrical tube space 163a and second through-hole 162b are blocked from each other, but because the connection between first cylindrical space 163a and first through-hole 162a is maintained, negative pressure from negative pressure source 72 is maintained to the suction opening of suction nozzle 60 (refer to FIGS. 14[b] and 15[b]). Also, when nozzle bolder 162 is lowered further, the connection of first through-hole 162a to first cylindrical tube space 163a, and the connection of second through-hole 162b to second cylindrical tube space 163b are maintained. Therefore, negative pressure from negative pressure source 72 is maintained to the suction opening of suction nozzle 60 (refer to FIGS. 14[c] and 15[c]).

Next, it is assumed that, in a state with first through-holes 162a connected to first cylindrical tube space 163a and second through-hole 162b connected to second cylindrical tube space 163b (the state shown in FIGS. 14[c] and 15 [c]), switching valve 174 is switched to a state blocking negative-pressure-passage-side port 174a and first nozzle-passage-side port 174c from each other, and connecting positive-pressure-passage-side port 174b and second nozzle-passage-side port 174d. In this case, as shown in FIG. 14(d), negative pressure from negative-pressure-passage-side port 178a is blocked, and instead positive pressure from positive-pressure-passage-side port 178b is supplied to the suction opening of suction nozzle 60.

In this manner, negative pressure and positive pressure supply device 170 connects negative pressure passage 73 to nozzle passage 62c of, from among the multiple nozzle holders 62, all the nozzle holders 62 regardless of the raising and lowering state, and is able to switch between connecting negative pressure passage 73 or positive pressure passage 83 to nozzle passage 62c of the nozzle holder 62 that is lowered. Accordingly, because positive pressure passage 83 is connected to only the suction opening of the suction nozzle 60 that is performing mounting operation, it is possible to accurately detect the flow amount of positive pressure passage 83 in accordance with mounting operation by detecting the air flow amount using flow amount sensor 89 provided in positive pressure passage 83.

Also, in the first embodiment, whether maintenance of the target nozzle is required is determined based on the air flow amount from flow amount sensor 79 provided in negative pressure passage 77 of second negative pressure supply unit 75. In contrast to this, here, whether maintenance of the target nozzle is required is determined based on the air flow amount from flow amount sensor 89 provided in positive pressure passage 83 of positive pressure supply unit 81. In this case, for example, whether maintenance is required may be determined based on the air flow amount detected by flow amount sensor 89 in a state after mounting operation is complete with the target nozzle slightly raised and the connection between positive pressure passage 83 and nozzle passage 62c (post-mounting flow amount Q3 received in S340).

Also, in the first embodiment, as shown in FIG. 5(b), negative pressure passage 77 of second negative pressure supply unit 75 is connected only to the one target nozzle (nozzle-passage-side port 78a) at the revolving position and thus lowerable. In contrast, here, negative pressure passage 77 may be connected to suction nozzles 60 near to the target nozzle (nozzle-passage-side port 78a).

Further, in the first embodiment, flow amount sensor 79 is provided in negative pressure passage 77 that supplies negative pressure to only the suction nozzle 60 when lowered. In contrast, instead of flow amount sensor 79, any type of sensor may be provided so long as it is capable of detecting the negative pressure supply state in negative pressure passage 77, such as a pressure sensor or the like. Further, in the first embodiment, flow amount sensor 89 is provided in positive pressure passage 83 that supplies positive pressure to only the suction nozzle 60 when lowered. In contrast, instead of flow amount sensor 89, any type of sensor may be provided so long as it is capable of detecting the positive pressure supply state in positive pressure passage 83, such as a pressure sensor or the like.

INDUSTRIAL APPLICABILITY

The present disclosure may be applied to the industrial field of component mounters and the like.

REFERENCE SIGNS LIST

10: component mounter; 11: base; 12: frame; 20: component supply device; 24: board conveying device; 26: component camera; 30: XY robot; 31: X-axis guide rail; 32: X-axis slider; 33: Y-axis guide rail; 34: Y-axis slider; 36: X-axis motor; 37: X-axis, position sensor; 38: Y-axis motor; 39: Y-axis position sensor; 40: head unit; 42: rotary head; 42d: insertion hole; 43: gear; 44: R-axis motor; 45: gear; 46: θ-axis motor; 47: gear; 50: raising and lowering device; 52: Z-axis motor; 54: Z-axis slider; 56: Z-axis position sensor; 60: suction nozzle; 62, 162: nozzle holder; 62a, 162a: first through-hole; 62b, 162b: second through-hole; 62; 162c: nozzle passage; 63, 163: cylindrical tube member; 63a, 163a: first cylindrical tube space; 63b, 163: second cylindrical tube space; 64: spring; 65: cylindrical tube member; 66: gear; 68: upper end section; 70, 70B, 170: negative pressure and positive pressure supply device; 71, 71B, 171: first negative pressure supply unit; 72: negative pressure source; 73: negative pressure passage; 74, 74B: on-off valve; 74a: negative-pressure-passage-side port; 74b: nozzle-passage-side port; 75: second negative pressure supply unit; 76: negative pressure source; 77: negative pressure passage; 78: switching valve; 78a: negative-pressure-passage-side port; 78b: positive-pressure-passage-side port; 78c: nozzle-passage-side port; 79, 79B: flow amount sensor; 81, 81B: positive pressure supply unit; 82: positive pressure source; 83: positive pressure passage; 84: pressure adjusting valve; 85, 84: on-off valve; 87: control valve; 89: flow amount sensor; 90: control device; 91: CPU; 92: ROM; 93: HDD; 94: RAM; 95: input-output interface; 96: bus; 100: management device; 101: CPU; 102: ROM; 103: HDD; 104: RAM; 105: input-output interface; 106: bus; 107: input device; 108: display; 174: switching valve; 174a: negative-pressure-passage-side port; 174b: positive-pressure-passage-side port; 174c: first nozzle-passage-side port; 174d: second nozzle-passage-side port

The invention claimed is:

1. A component mounter for picking up a component and mounting the component on a mounting target, the component mounter comprising:
    a suction nozzle configured to pick up the component at a tip section of the suction nozzle using suction;
    a rotary head including a rotating body on which multiple nozzle holders are arranged in a circumferential direction, each of the nozzle holders being configured to hold the suction nozzle;
    a moving device configured to move the rotary head in a horizontal direction;
    a rotating device configured to rotate the rotating body such that the multiple nozzle holders revolve in the circumferential direction; and
    a raising and lowering device configured to lower, from among the multiple nozzle holders, a first nozzle holder that is at a specified revolving position, wherein
    the multiple nozzle holders each include a nozzle passage connected to the tip section of the suction nozzle being held by the first nozzle holder,
    the rotating body includes a first negative pressure unit configured to supply negative pressure simultaneously to the nozzle passages of all of the nozzle holders via a first port of the respective nozzle holders, and a second negative pressure unit configured to supply negative pressure to a first nozzle passage of the first nozzle holder positioned at the specified revolving position via a second port of the first nozzle holder,
    the first port is open when the nozzle holder is at a raised position, and closed when the nozzle holder is at a lowered position, and
    the second port is closed when the nozzle holder is at a raised position, and open when the nozzle holder is at the lowered position.

2. The component mounter according to claim 1, wherein the first port and the second port are both open when the nozzle holder is at an intermediate position that is between the raised position and the lowered position.

3. The component mounter according to claim 1, further including
    a negative pressure supply state detecting sensor connected to the second negative pressure unit and configured to detect a negative pressure supply state of the second negative pressure unit, and
    a processing circuitry configured to determine a component pickup state by the suction nozzle or a suction nozzle state, based on the negative pressure supply state detected by the negative pressure supply state detecting sensor.

4. The component mounter according to claim 1, further including
    a negative pressure supply state detecting sensor connected to the second negative pressure unit and configured to detect a negative pressure supply state of the second negative pressure unit, and
    a processing circuitry configured to determine whether maintenance is required for the rotary head or for the suction nozzle, based on the negative pressure supply state detected by the negative pressure state detecting sensor.

5. The component mounter according to claim 1, wherein the rotating body includes
    a positive pressure unit configured to supply positive pressure to the nozzle holder, from among the multiple nozzle holders, positioned at the specified revolving position via the second port, and
    a switching valve configured to switch the second port to and from the second negative pressure unit and the positive pressure unit.

* * * * *